(12) United States Patent
Kishimoto et al.

(10) Patent No.: US 10,957,882 B2
(45) Date of Patent: Mar. 23, 2021

(54) VAPOR DEPOSITION MASK, PRODUCTION METHOD THEREFOR, AND PRODUCTION METHOD FOR ORGANIC EL DISPLAY DEVICE

(71) Applicant: SAKAI DISPLAY PRODUCTS CORPORATION, Sakai (JP)

(72) Inventors: Katsuhiko Kishimoto, Sakai (JP); Kazunobu Mameno, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/625,655

(22) PCT Filed: Mar. 5, 2018

(86) PCT No.: PCT/JP2018/008331
§ 371 (c)(1),
(2) Date: Apr. 17, 2020

(87) PCT Pub. No.: WO2019/171432
PCT Pub. Date: Sep. 12, 2019

(65) Prior Publication Data
US 2020/0403188 A1 Dec. 24, 2020

(51) Int. Cl.
*H01L 29/08* (2006.01)
*H01L 51/56* (2006.01)
*H05B 33/10* (2006.01)

(52) U.S. Cl.
CPC ............. *H01L 51/56* (2013.01); *H05B 33/10* (2013.01)

(58) Field of Classification Search
CPC ..... H01L 51/56; H01L 21/0337; H01L 29/08; H05B 33/10

USPC ......................................................... 438/694
See application file for complete search history.

(56) References Cited

U.S. PATENT DOCUMENTS

| 4,648,347 | A | * | 3/1987 | Aichert | ................. C23C 14/562 118/504 |
| 5,937,272 | A | * | 8/1999 | Tang | .................... H01L 27/3211 438/158 |
| 8,987,142 | B2 | * | 3/2015 | Lee | ..................... H01L 21/0332 438/703 |

(Continued)

FOREIGN PATENT DOCUMENTS

JP  2014-135246 A  7/2014
JP  2015-082411 A  4/2015

(Continued)

OTHER PUBLICATIONS

International Search Report for International application No. PCT/JP2018/008331.

*Primary Examiner* — Caleb E Henry
(74) *Attorney, Agent, or Firm* — ScienBiziP, P.C.

(57) ABSTRACT

A vapor deposition mask is provided with: a resin film, which has at least one of first to third opening patterns in which first to third openings, for forming first to third subpixels that configure one pixel of a display panel, are disposed with a fixed periodicity; and a metal support layer, which is bonded to the resin film and has an opening pattern for fourth openings that are formed so as to be able to encompass all of the first to third openings of the resin film. In regions of the resin film exposed by the fourth openings of the metal support layer, one or two of the first to third openings of the resin film are formed.

13 Claims, 14 Drawing Sheets

(56) References Cited

U.S. PATENT DOCUMENTS

| | | | |
|---|---|---|---|
| 9,622,319 B2* | 4/2017 | Sonoda | H01L 51/0002 |
| 2014/0041586 A1* | 2/2014 | Wu | H01L 51/0011 |
| | | | 118/720 |
| 2014/0041587 A1* | 2/2014 | Wu | C23C 14/042 |
| | | | 118/720 |
| 2014/0193974 A1* | 7/2014 | Lee | H01L 21/0332 |
| | | | 438/669 |
| 2015/0361546 A1* | 12/2015 | Ochi | C23C 14/04 |
| | | | 427/255.28 |
| 2015/0364526 A1 | 12/2015 | Peng et al. | |
| 2017/0037508 A1* | 2/2017 | Ma | H01L 51/56 |
| 2017/0092862 A1 | 3/2017 | Obata et al. | |
| 2017/0256713 A1 | 9/2017 | Obata et al. | |
| 2018/0040855 A1* | 2/2018 | Chen | C23C 14/042 |
| 2019/0044069 A1 | 2/2019 | Nishida et al. | |
| 2019/0055640 A1* | 2/2019 | Sakio | C23C 14/042 |
| 2019/0067580 A1* | 2/2019 | Nishida | C23C 14/24 |
| 2019/0084088 A1* | 3/2019 | Takei | B23K 26/362 |
| 2019/0100835 A1* | 4/2019 | Obata | C23C 14/042 |
| 2019/0106781 A1* | 4/2019 | Sakio | C23C 14/24 |
| 2019/0262955 A1* | 8/2019 | Kishimoto | C23C 14/04 |

FOREIGN PATENT DOCUMENTS

| | | |
|---|---|---|
| JP | 2015-200019 A | 11/2015 |
| JP | 2016-513334 A | 5/2016 |
| WO | 2017/056656 A1 | 4/2017 |
| WO | 2017/110123 A1 | 6/2017 |

\* cited by examiner

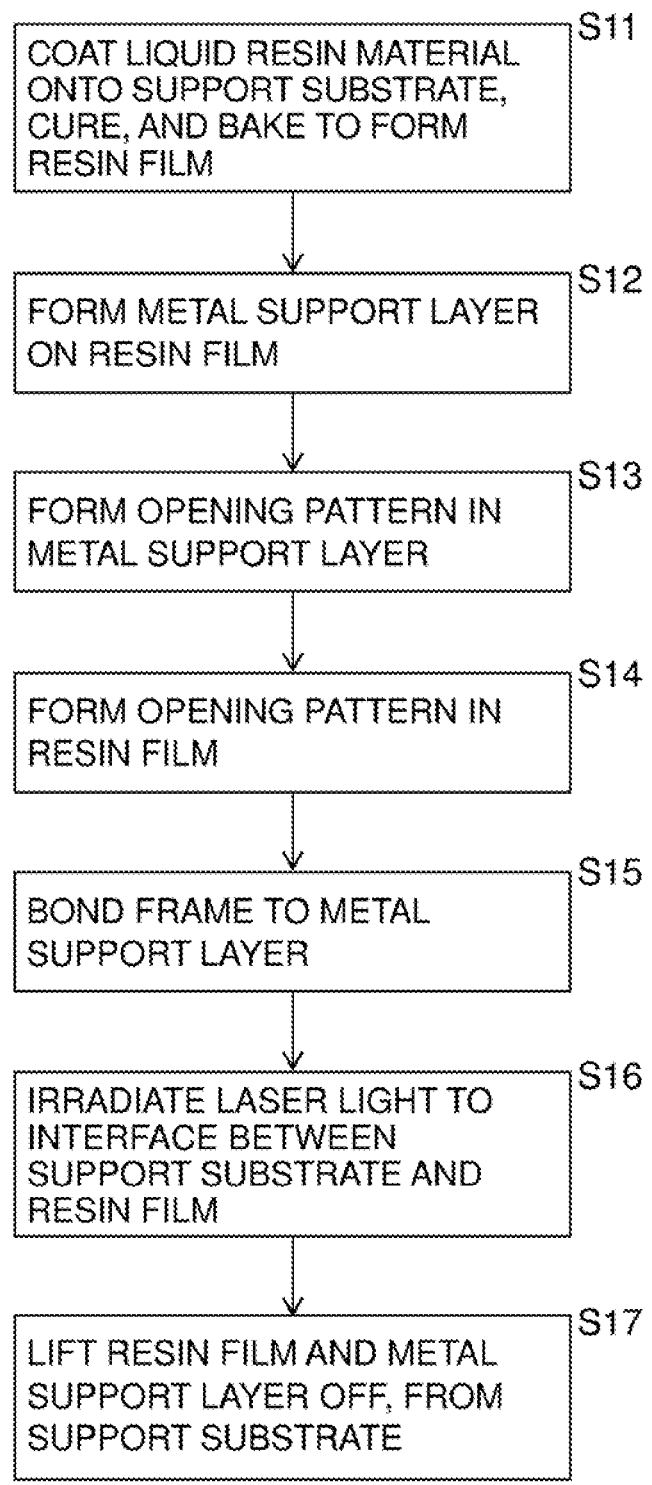

VAPOR DEPOSITION MASK, PRODUCTION METHOD THEREFOR, AND PRODUCTION METHOD FOR ORGANIC EL DISPLAY DEVICE

TECHNICAL FIELD

The present invention relates to a vapor-deposition mask, a method of manufacturing a vapor-deposition mask, and a method of manufacturing an organic-EL display apparatus.

BACKGROUND ART

In a case of manufacturing an organic-EL display apparatus, an organic layer corresponding to each pixel is deposited on a substrate on which is formed a drive circuit using TFTs, for example. While an organic-EL display apparatus for color displaying can be made to be displayed in color using color filters, the color displaying can also be carried out by forming organic-EL display elements such that light of red, green, and blue is emitted by the respective sub-pixels. Such an organic deposition layer is formed by arranging an insulating substrate and a vapor-deposition mask such that they are superimposed onto each other, and vapor depositing an organic material in a required organic layer only at required pixel positions through openings of the above-mentioned vapor-deposition mask. As the above-mentioned vapor-deposition mask, a fine-pattern vapor-deposition mask is demanded in conjunction with increased definition and increased density of the display apparatus in recent years, and a resin film, or a composite mask in which a metal support layer is bonded to the resin film, is considered.

Such a composite mask is formed, as shown in FIG. 9A, for example, in a structure with a metal support layer 82 in which an opening 82a is larger than an opening 81a of a resin film 81, the structure being protected by the metal support layer 82 up to a peripheral edge of the opening 81a of the resin film 81 (see Patent document 1, for example). The above-mentioned metal support layer 82 is preferably formed up to the peripheral edge of the opening 81a of the resin film 81. However, as shown in FIG. 9B, the structure can also be formed such that a collection of the opening 81a of the resin film 81, the opening 81a being in a plurality, is protected by the one opening 82a of the metal support layer 82 (see Patent document 1, for example). It is considered that, even with the above-mentioned structure, the metal support layer 82 is formed up to the peripheral edge of a group of the plurality of openings 81a of the resin film 81, so that it can sufficiently protect the resin film 81. In other words, in the above-mentioned structure, the openings 81a of the resin film 81 are formed in the one opening 82a of the metal support layer 82, and there is no region of the resin film 81 in which region the openings 81a is not formed while the openings 81a can be formed in the region of the resin film 81.

On the other hand, as shown in FIG. 9A, for example, in a case that the resin film 81 is bonded to a support substrate (not shown) to form a pattern of the openings 81a by laser light A when a vapor-deposition mask 80 is formed using the resin film 81, adhesion between the resin film 81 and the support substrate can be poor, or it can be susceptible to entangle air bubbles or foreign substances in between the resin film 81 and the support substrate. As the openings 81a are very fine such that the size thereof is approximately 10 to 30 μm for each one side, the openings 81a cannot be formed accurately in a case that there is fine floating as described previously, or entanglement of the air bubbles or the foreign substances. Therefore, it is proposed that the resin film 81 is directly formed on a support substrate by coating a liquid resin on the support substrate and baking the coated liquid resin (see Patent document 2, for example).

In this case, the resin film 81 and the support substrate are in close contact with each other across the entire surface, making it possible to accurately form the openings 81a being fine by the laser light A. However, as the resin film 81 and the support substrate are in close contact with each other, in a case of attempting to forcibly lift the resin film 81 after forming the opening 81 off, there is a risk of deforming the openings 81a. Therefore, in Patent document 2, laser light B is irradiated to a short-wavelength light-absorbing layer (not shown), being formed in between the resin film 81 and the support substrate during baking, from a side of the support substrate being not shown (for example, the a side of an arrow B in FIG. 9A), and thereby, the short-wavelength light-absorbing layer is altered, and thereafter, the resin film 81 is lifted off. A method can be considered in which an irradiation source of the laser light B in this case possibly linearly spreads the laser light B to irradiate the linearly spread laser light B, for example, and the laser light B is irradiated onto the entire surface of the resin film 81 by scanning in the length direction of the resin film 81 while linearly irradiating to an entire surface of the resin film 81 in the width direction.

PRIOR ART DOCUMENTS

Patent Documents

Patent Document 1: JP 2014-135246 A
Patent Document 2: WO 2017/056656 A1

SUMMARY OF THE INVENTION

Problem to be Solved by the Invention

As described previously, in a case of lifting the resin film 81 off, from the support substrate in which the openings 81a are formed, it is preferable to irradiate the laser light B onto an adhering surface thereof. In this case, when the vapor-deposition mask 80 is a composite mask, the absorbing property of the laser light B differs between a portion with the metal support layer 82 and a portion without the metal support layer 82 at the short-wavelength light-absorbing layer being located at the interface thereof. Therefore, an intensity of the laser light B to be irradiated needs to be changed between a case with the metal support layer 82 and a case without the metal support layer 82 at an irradiation position of the linear laser light B. In this case, when manufacturing a plurality of composite mask each having the same openings 81a, the laser light B can be made to be absorbed at a uniform intensity across the entire surface of the composite mask while automatically adjusting the irradiation intensity of the laser light B by setting a program to change the irradiation intensity of the laser light B in accordance with the scanning speed of the laser light B.

However, in a case of changing a light-emitting color for each light-emitting element by depositing an organic layer of a material being different for each of a red (R), a green (G), and a blue (B) sub-pixel of one pixel of a display apparatus, not using a color filter, for example, a vapor-deposition mask 80 is required for the respective sub-pixels. In this case, the positions of the openings 81a of the resin film 81 differ in accordance with the vapor-deposition mask 80 for each of R, G, and B. Therefore, in a case that the metal support layer 82 is formed up to the peripheral edge of the openings 81a, the pattern of the openings 82a of the metal support layer 82 can differ in accordance with the vapor-deposition mask 80 for the sub-pixel of each of R, G, and B. A set of the above-mentioned vapor-deposition masks 80 is not limited to three types being R, 4 and B, so that masks of other combinations such as R and (R and B, and G and B are also needed, for example. Therefore, in order to manufacture the one set of vapor-deposition masks 80, conditions for irradiating the laser light B to lift off, from a support substrate 15, the composite mask in which the resin film 81 and the metal support layer 82 are bonded as described previously need to be changed each time. In other words, there is a problem that manufacturing a plurality of vapor-deposition masks 80 as the above-mentioned set becomes very cumbersome.

Moreover, in a case of forming an opening pattern of the opening 82a of the metal support layer 82 by etching after forming a metal layer on the resin film 81 using a method such as vapor-deposition or plating, depending on the vapor-deposition mask 80 for the sub-pixel of R, G, or B, the opening size and the opening pattern of the resist layer thereof vary from each other, causing the manufacturing process to be complicated. Moreover, as the vapor-deposition mask 80 increases in size, forming of the opening pattern of the metal support layer 82 also becomes difficult.

In light of such conditions as described above, an object of the present invention is to provide a vapor-deposition mask and a method of manufacturing a vapor-deposition mask that make it possible to manufacture a set of vapor-deposition masks in which opening patterns differs from each other in accordance with sub-pixels such as R, G, and B.

Another object of the present invention is to provide a method of manufacturing an organic-EL display apparatus that makes it possible to efficiently produce a deposition layer of an organic layer.

Means to Solve the Problem

A vapor-deposition mask according to Embodiment 1 comprises: a resin film comprising at least one opening pattern of a first opening pattern in which a first opening to form a first sub-pixel making up one pixel of a display panel is arrayed at a constant interval, a second opening pattern in which a second opening to form a second sub-pixel making up the one pixel is arrayed at the constant interval, and a third opening pattern in which a third opening to form a third sub-pixel making up the one pixel is arrayed at the constant interval; and a metal support layer being joined to the resin film and comprising an opening pattern of a fourth opening being formed so as to allow enclosing all of the first opening, the second opening, and the third opening of the resin film, wherein any one or two openings of the first opening, the second opening, and the third opening of the resin film are formed in a region being exposed by the fourth opening of the metal support layer.

A method of manufacturing a vapor-deposition mask according to Embodiment 2 comprises: forming a resin film on a support substrate; forming a metal support layer on the resin film, the metal support layer comprising an opening pattern of a fourth opening; irradiating laser light to the resin film being exposed by the fourth opening to form any one or two opening patterns of a first opening, a second opening, and a third opening for forming respectively a first sub-pixel, a second sub-pixel, and a third sub-pixel making up one pixel of a display panel; after irradiating laser light to a joint portion between the support substrate and the resin film, lifting the resin film and the metal support layer off, from the support substrate, wherein the fourth opening of the metal support layer is formed so as to allow enclosing all of the first opening, the second opening, and the third opening of the resin film.

A method of manufacturing an organic-EL display apparatus according to Embodiment 3 comprises: forming at least a TFT and a first electrode on an apparatus substrate; vapor depositing an organic material on the surface of the apparatus substrate using a vapor-deposition mask to form an organic deposition layer; and forming a second electrode on the deposition layer.

Effects of the Invention

According to the embodiments of the present invention, the fourth opening of the metal support layer is formed such that it encloses all of the first opening, the second opening, and the third opening (for example, openings for forming an R sub-pixel, a G sub-pixel, and a B sub-pixel, respectively) of the resin film, so that the metal support layer does not close these regardless of which one of the first opening, the second opening, and the third opening is formed. Therefore, the opening patterns of the metal support layers are the same in the vapor-deposition masks to form all of the R sub-pixel, the G sub-pixel, and the B sub-pixel, for example, making it possible to make conditions for the laser light irradiation the same at the time of lifting the resin films and the metal support layers off. Moreover, the metal support layers can be used in common from each other in a case of manufacturing the vapor-depositions masks for the R sub-pixel, the G sub-pixel, and the B sub-pixel, for example.

BRIEF DESCRIPTION OF THE DRAWINGS

FIG. 5 schematically shows a flowchart of a method of manufacturing the vapor-deposition mask being the present embodiment;

EMBODIMENT FOR CARRYING OUT THE INVENTION

Figure 1A:
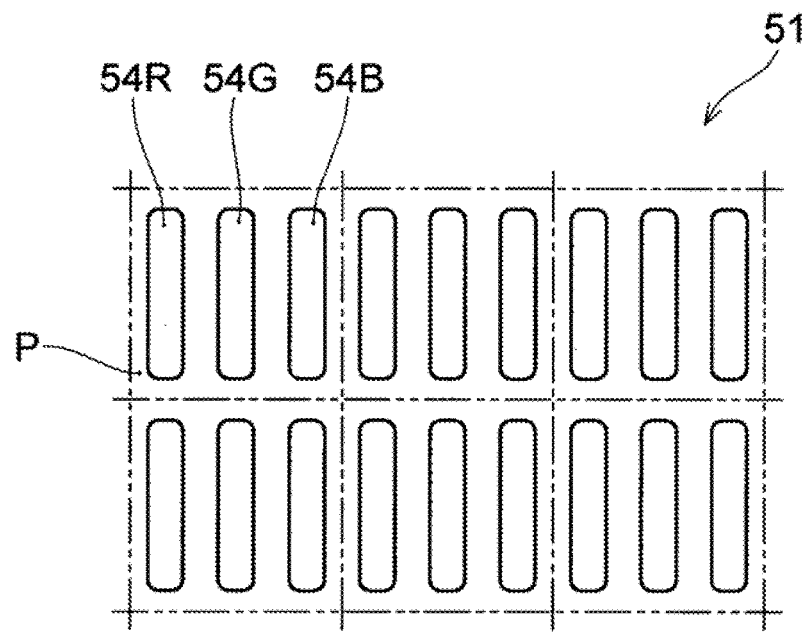
FIG. 1A schematically shows an explanatory plan view of an array of sub-pixels to be formed using a vapor-deposition mask being the present embodiment.
Figure 1B:
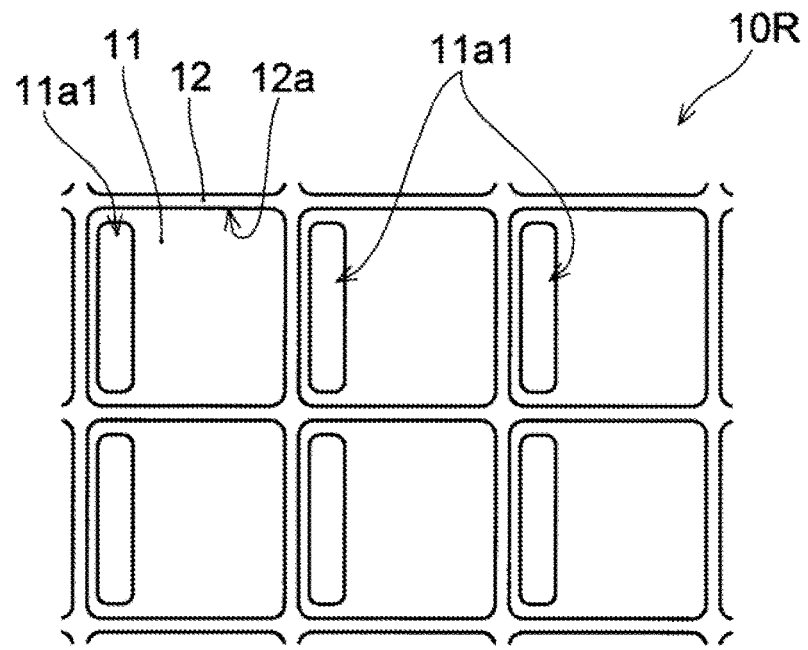
FIG. 1B schematically shows a plan view of the vapor-deposition mask to form an R sub-pixel in FIG. 1A.
Figure 1C:
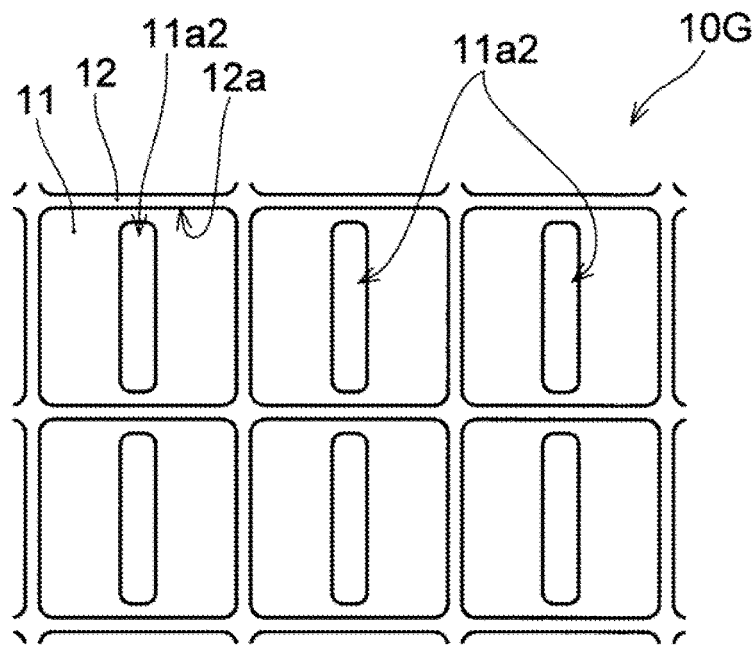
FIG. 1C schematically shows a plan view of the vapor-deposition mask to form a G sub-pixel in FIG. 1A.
Figure 1D:
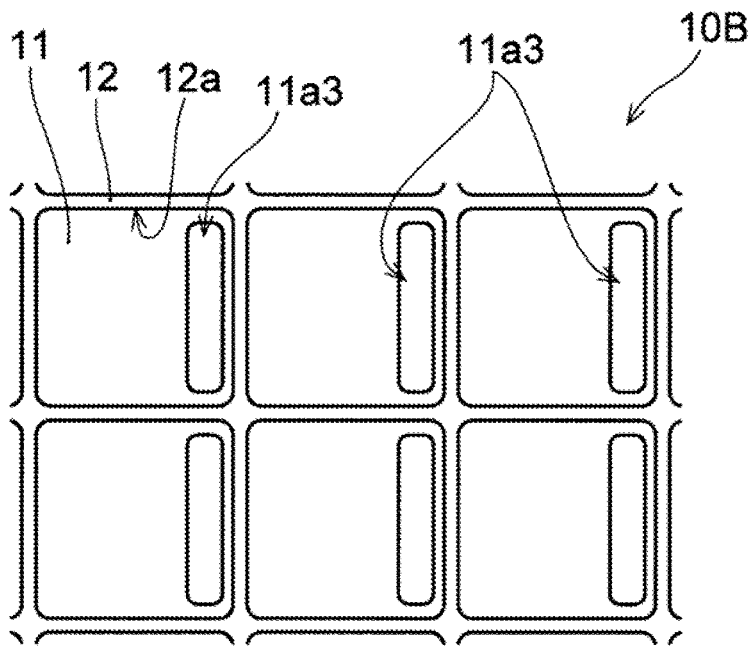
FIG. 1D schematically shows a plan view of the vapor-deposition mask to form a B sub-pixel in FIG. 1A.

Next, with reference to the drawings, a vapor-deposition mask according to the present embodiment will be explained. FIG. 1A schematically shows a plan view of an array of sub-pixels of a display panel, the array to be formed using a vapor-deposition mask being the present embodiment, and FIGS. 1B to 1D schematically shows a plan view of the vapor-deposition mask to form each of the R sub-pixel, the G sub-pixel, and B sub-pixel, respectively, the sub-pixels corresponding to the above-mentioned array. For brevity, while a vapor-deposition mask to form only the respective sub-pixel is shown for the respective vapor-deposition mask shown in FIGS. 1B to 1D, the vapor-deposition mask can be to form two sub-pixels of the R sub-pixel and the G sub-pixel, the G sub-pixel and the B sub-pixel, or the B sub-pixel and the R sub-pixel.

The vapor-deposition mask being the present embodiment comprises: a resin film 11 comprising at least one opening pattern of a first opening pattern in which a first opening 11a1 to form a first sub-pixel 54R making up one pixel P of the display panel is arrayed at a constant interval, a second opening pattern in which a second opening 11a2 to form a second sub-pixel 54G making up the one pixel P is arrayed at the constant interval, and a third opening pattern in which a third opening 11a3 to form a third sub-pixel 54B making up the one pixel is arrayed at the constant interval; and a metal support layer 12 being joined to the resin film 11 and comprising an opening pattern of a fourth opening 12a being formed so as to allow enclosing all of the first opening 11a1, the second opening 11a2, and the third opening 11a3 of the resin film 11. Then, any one or two openings of the first opening 11a1, the second opening 11a2, and the third opening 11a3 of the resin film 11 are formed in a region being exposed by the fourth opening 12a of the metal support layer 12 of the resin film 11.

In other words, in the present embodiment, as shown in FIGS. 1B to 1D, one each of the opening 11a1, the opening 11a2, and the opening 11a3 are formed in the resin film 11 being exposed by the one fourth opening 12a of the metal support layer 12. In FIGS. 1B to 1D are shown examples of a vapor-deposition mask 10R, a vapor-deposition mask 10G, and a vapor-deposition mask 10B to form only the respective sub-pixel 54R, sub-pixel 54G, and sub-pixel 54B making up the one pixel. Then, the fourth opening 12a being formed in the metal support layer 12 has the same shape when either of the openings 11a1, 11a2, and 11a3 for the sub-pixels is formed. Namely, the fourth opening 12a is formed so as to enclose one unit comprising a set of a first opening 12a1, a second opening 12a2, and a third opening 12a3, while not being formed up to the peripheral edges of the first opening 11a1, the second opening 11a2, and the third opening 11a3 for each of the sub-pixels. In other words, the present embodiment is characterized in that the resin film 11 being exposed by the fourth opening 12a has a region, where the openings for the sub-pixels can be formed, but where certain opening(s) for certain sub-pixel(s) is not formed.

While the fourth opening 12a of the metal support layer 12 is formed with the first opening 11a1, the second opening 11a2, and the third opening 11a3 making up one pixel being as one unit in this example, the fourth opening 12a can be formed so as to enclose at least two units. Since deflection occurs in the resin film 11 in a case that the fourth opening 12a is formed so as to enclose too many units, it is preferable that the fourth opening 12a be formed so as to enclose 10 units or less from a point of view of reinforcing the resin film 11.

In the example shown in FIG. 1A, rectangular-shaped R, G, and B sub-pixels 54R, 54G, and 54B make up one pixel P. Then, the rectangular-shaped pixels 54R, 54G, and 54B are arrayed alternately at a constant interval to form a display panel. Here, once the number of pixels and the size of the display panel are determined, the array and the size of one pixel P are also determined. Then, once the opening pattern and the size of the fourth opening 12 of the metal support layer 12 are determined in accordance with the array and the size of one pixel, the same metal support layer 12 can be used to produce each of the vapor-deposition masks 10R, 10G, and 10B for forming the R, G, and B sub-pixels.

Moreover, as shown in FIGS. 1B to 1D, each of the vapor-deposition masks 10R, 10G, and 10B comprises each of the resin film 11 and the metal support layer 12. Then, in the resin film 11 of each of the vapor-deposition masks 10R, 10G, and 10B, a opening pattern in which each of the first opening 11a1, the second opening 11a2, and the third opening 11a3 to form each of the sub-pixels 54R, 54G, and 54B is arrayed at a constant interval, is formed. On the other hand, in the metal support layer 12 of each of the vapor-deposition masks 10R, 10G, and 10B, the fourth opening 12a so as to surround all of the opening 11a1, the second opening 11a2, and the third opening 11a3 of the resin film 11 to form the R, G, and B sub-pixels, is formed, respectively. Therefore, the metal support layer 12 is the same regardless of each of the vapor-deposition masks 10R, 10G, and 10B.

The dimension of one pixel is such that one side thereof is approximately 42. 5 μm (600 PPI), the dimension of the opening 12a of the metal support layer 12 is approximately 37.5 μm by approximately 37.5 μm, the respective dimensions of the openings 11a1, 11a2, and 11a3 of the resin film 11 are approximately 30 μm by approximately 10 μm, and the width of interval (rib) of the fourth opening 12a of the metal support layer 12 is approximately 5 μm. Four vertices of the fourth opening 12a of the metal support layer 12, the fourth opening 12a having a quadrilateral shape, as shown in FIGS. 1B to 1D can be rounded and the radius of curvature thereof is 1 μm or more, and 5 μm or less, and typically approximately 3 μm. In this way, the joint surface between the resin film 11 and the metal support layer 12 increases in size, making it possible to further suppress deflection of the resin film 11. The same applies to the vertices of the metal support layer shown in other FIGS.

The resin film 11 is made up of, for example, a polyimide (PI) resin, a polyethylene naphthalate (PEN) resin, a polyethylene terephthalate (PET) resin, a cycloolefin polymer (COP) resin, a cyclic olefin copolymer (COC) resin, a polycarbonate (PC) resin, a polyamide (PA) resin, a polyamide imide (PAI) resin, a polybutylene terephthalate (PBT) resin, a polyethylene (PE) resin, a polyvinyl alcohol (PVAL) resin, polypropylene (PP) resin, a polystyrene (PS) resin, a polyacrylonitrile resin, an ethylene-vinylacetate copolymer (EVA) resin, an ethylene vinyl alcohol copolymer resin, an ethylene-methacrylic acid copolymer resin, a polyvinyl chloride (PVC) resin, a polyvinylidene chloride (PVDC) resin, or an ionomer resin. The linear expansion coefficient of the resin film 11 is preferably close to the linear expansion coefficient of an apparatus substrate 51 at the time of use as the vapor-deposition mask 10R, 10G, or 10B from a viewpoint of preventing misalignment between the apparatus substrate and the vapor-deposition mask in conjunction with a temperature rise at the time of vapor deposition. Specifically, the difference in linear expansion coefficient between the apparatus substrate 51 and the vapor-deposition masks 10R, 10G, and 10B is preferably 6 ppm/° C. or less, and, more preferably, 3 ppm/° C. or less. Moreover, taking into account that the apparatus substrate 52 is generally made up of glass, the resin film 11 is more preferably a polyimide resin. Moreover, the resin film 1l is formed to the thickness of several μm or more and several tens of μm or less, for example, to the thickness of approximately 5 μm.

The metal support layer 12 is formed with a metal material such as Fe, a Fe—Ni alloy, invar (Fe-35 weight % of Ni), for example. The use of a magnetic substance as the metal support layer 12 is preferable since the vapor-deposition masks 10R, 10G, and 10B can be adsorbed by magnetic force at the time of fixing them to the apparatus substrate 51. Moreover, the metal support layer 12 is formed to the thickness of 1 μm or more, and 15 μm or less, for example.

According to such vapor-deposition mask 10R, 10G, and 10B, as the vapor-deposition mask 10R to form the R sub-pixel, for example, is not formed in a structure being protected by the metal support layer 12 up to the peripheral edge of the opening 11a of the resin film 11 to form the R sub-pixel, but is formed in a structure being protected by the metal support layer 12, the structure comprising even the opening 11a of the resin film 11 to form the G sub-pixel and the B sub-pixel, the metal support layer 12 does not close all of the openings 11a1, 11a2, and 11a3 for sub-pixels regardless of whether which opening 11a is formed in the resin film 11. Therefore, a large number of the above-mentioned metal support layer 12 can be manufactured for use also in the other vapor-deposition masks 10G, 10B, making it possible to manufacture a set of the vapor-deposition masks 10R, 10G, and 10B through uniform operations.

Figure 2A:
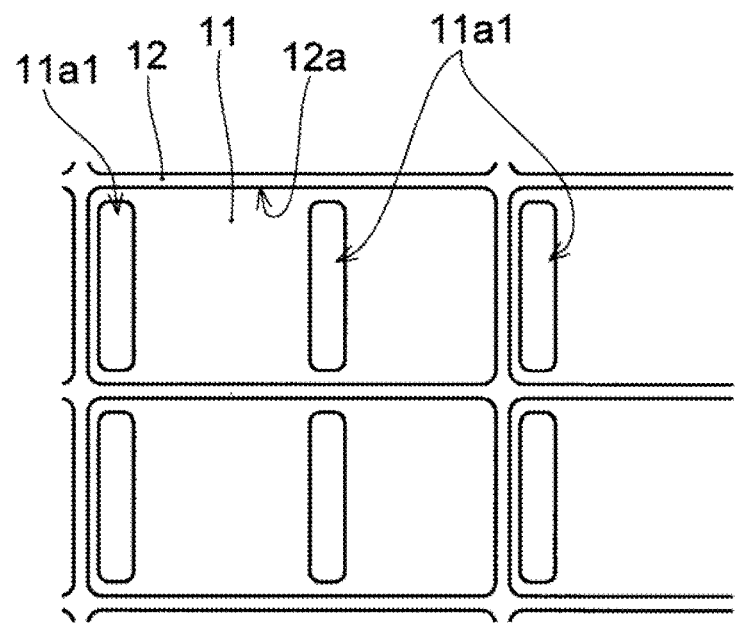
FIG. 2A shows a view similar to FIG. 1B, in which view a fourth opening pattern of a metal support layer is different.
Figure 2B:
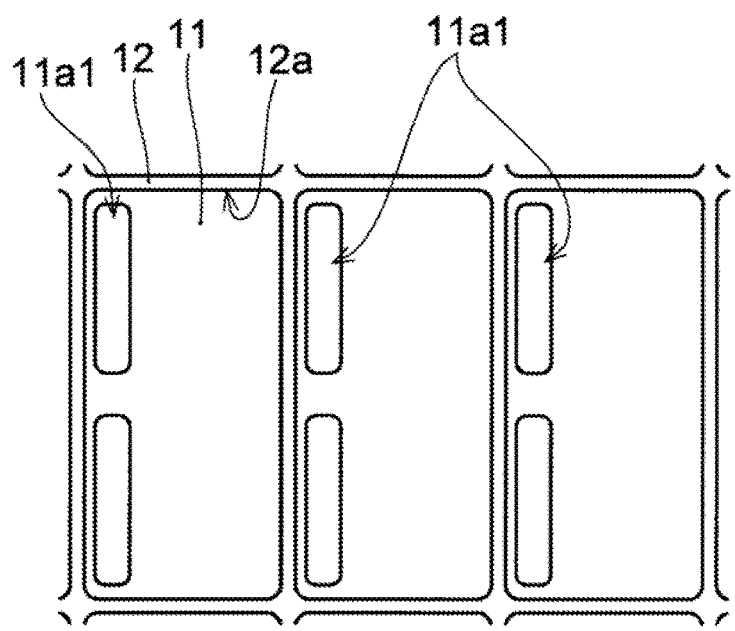
FIG. 2B shows a view similar to FIG. 1B, in which view the fourth opening pattern of the metal support layer is further different.
Figure 2C:
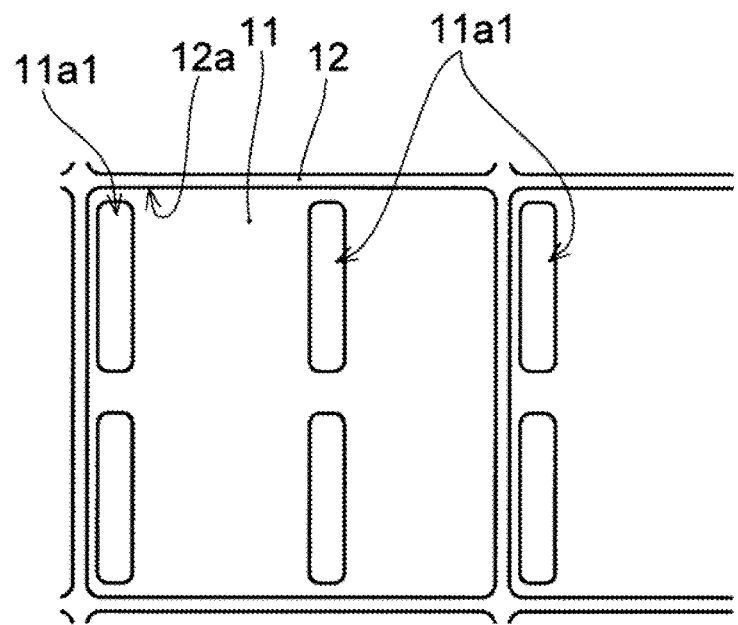
FIG. 2C shows a view similar to FIG. 1B, in which view the fourth opening pattern of the metal support layer is further different.
Figure 2D:
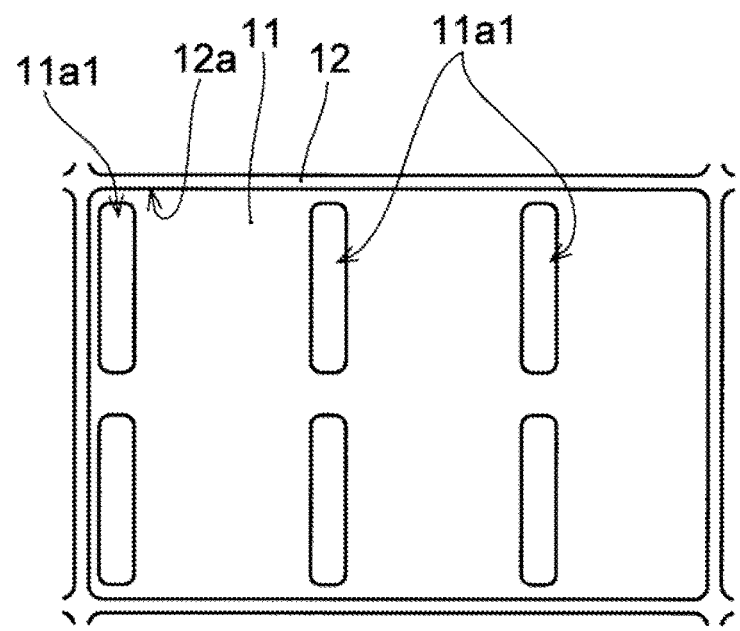
FIG. 2D shows a view similar to FIG. 1B, in which view the fourth opening pattern of the metal support layer is further different.

Here, in the vapor-deposition mask 10R, 10G, and 10B according to the present embodiment, as in the vapor-deposition mask 10R to form the R sub-pixel shown in FIG. 2A, for example, the fourth opening 12a of the metal support layer 12 can be formed in a size such that it comprises any of the first openings 11a1 of the resin film 11 corresponding to two pixels comprising one row and two columns. Moreover, as shown in FIG. 2B, the fourth opening 12a can be formed in a size such that it comprises any of the first openings 11a1 corresponding to two pixels comprising two rows and one column. Furthermore, as shown in FIG. 2C, the fourth opening 12a can be formed in a size such that it comprises any of the first openings 11a1 corresponding to four pixels comprising two rows and two columns, or, as shown in FIG. 2D, the fourth opening 12a can be formed in a size such that it comprises any of the first openings 11a1 corresponding to six pixels comprising two rows and three columns. In the vapor-deposition masks shown in FIGS. 2A to 2D, two, two, four, or six first openings 11a1 of the resin film 11 is comprised in the fourth opening 12a of each of the metal support layers 12, respectively.

Moreover, as described below, the fourth opening 12a of the metal support layer 12 can be formed in accordance with the plurality of pixels comprised in a unit region of irradiation of laser light to form an opening pattern such as the first opening 11a1 of the resin film 11. In other words, the size and the opening pattern can be made such that the fourth openings 12a of the metal support layers 12 of the vapor-deposition masks 10R, 10G, and 10B are the same each and the resin film 11 can be reinforced to some extent.

Moreover, while the opening pattern and the size of such as the first opening 11a1 of the resin film 11 being shown in FIGS. 1B to 1D are formed so as to have any one of the first opening 11a1, the second opening 11a2, and the third opening 11a3 to form the R, G, or B sub-pixel 54R, 54G, or 54B, the vapor-deposition mask can be formed so as to have two openings in accordance with the number of sub-pixels in common to collectively vapor deposit at one time the sub-pixels in common being comprised in each sub-pixel.

Moreover, while the one pixel shown in FIG. 1A is made up of R, G, and B sub-pixels, it can be configured to comprise at least one additional sub-pixel such as W (white). In this case, separately from the above-mentioned vapor-deposition mask 10R, 10G, or 10B, a vapor-deposition mask having an opening pattern of the opening 11a making up the W sub-pixel can be prepared. While the one pixel is formed with vapor depositing at least four sub-pixels in this case, in one vapor-deposition mask of one set of vapor-deposition masks according to the present embodiment as described above, the openings, of which number is one less than a number of sub-pixels as the upper limit in the resin film in a region corresponding to one pixel, are preferably provided.

Figure 3A:
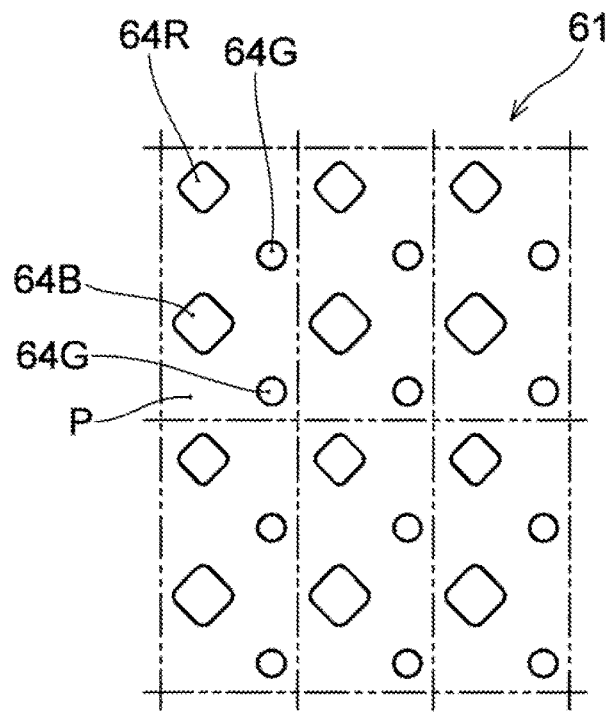
FIG. 3A shows a view similar to FIG. 1A, in which view the shape of the sub-pixels is different.
Figure 3B:
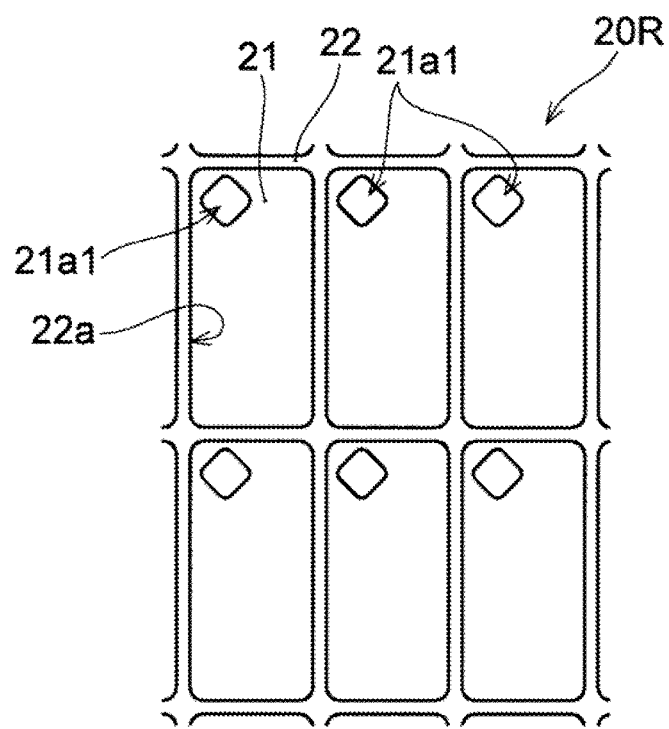
FIG. 3B schematically shows a plan view of the vapor-deposition mask to form a R sub-pixel in FIG. 3A.
Figure 3C:
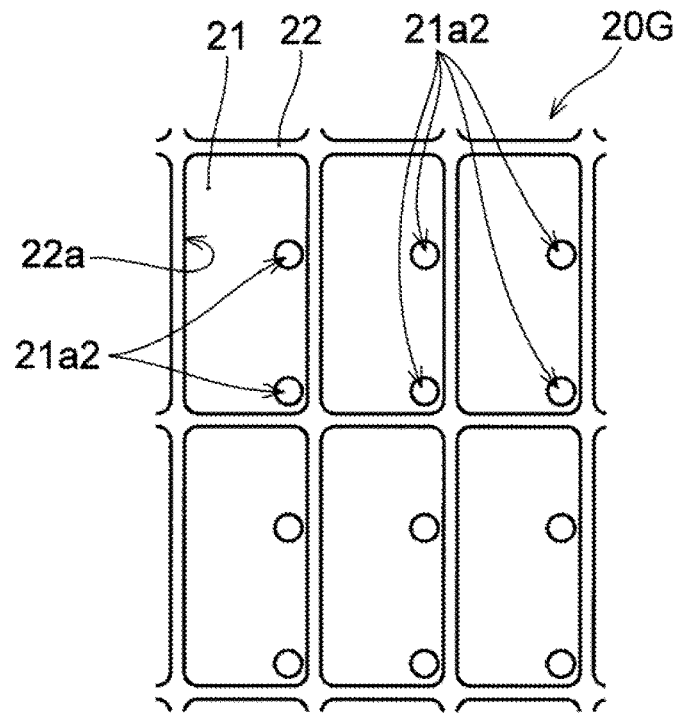
FIG. 3C schematically shows a plan view of the vapor-deposition mask to form a G sub-pixel in FIG. 3A.
Figure 3D:
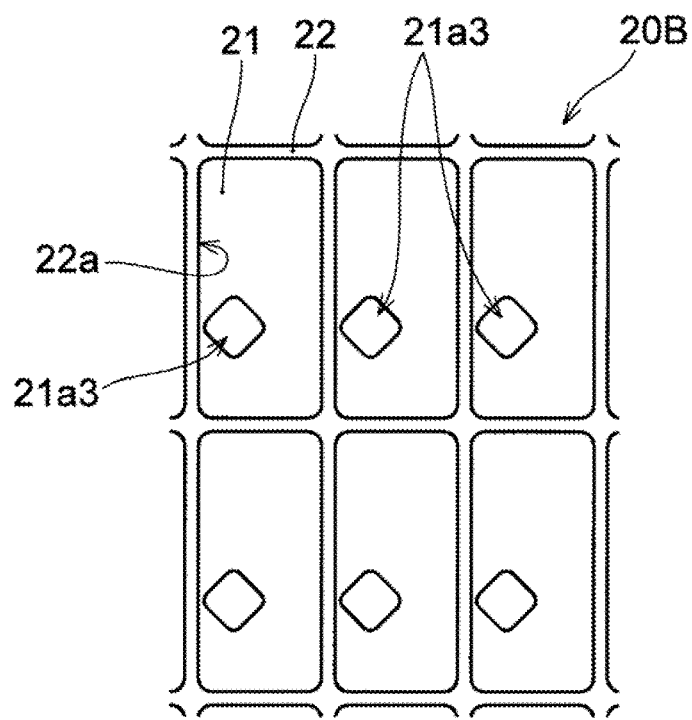
FIG. 3D schematically shows a plan view of the vapor-deposition mask to form a B sub-pixel in FIG. 3A.

FIG. 3A schematically shows a plan view of an array of sub-pixels of a display panel being formed using vapor-deposition masks being a different embodiment, while FIGS. 3B to 3D show schematic plan views of the vapor-deposition masks to form an R, G, and B sub-pixel corresponding to the above-mentioned array, respectively.

As shown in FIG. 3A, each of R, G, and B sub-pixels 64R, 64G, and 64B is formed in the display panel 61. Then, the dot-shaped sub-pixel is arrayed alternately at a constant interval such that two G sub-pixels are arrayed for one R sub-pixel or B sub-pixel. Here, in the array shown in FIG. 3A, one each of the R sub-pixel and the B sub-pixel and two of the G sub-pixels are to make up one pixel P.

Even in vapor-deposition masks 20R, 20G, and 20B to form the R, G, and B sub-pixels of such an array, as shown in FIGS. 3B to 3D, an opening pattern of an opening 22a of a metal support layer 22 can be set in accordance with a size of one pixel P and an array at a constant interval to obtain the same effect as that of the vapor-deposition masks 10R, 10G, and 10B to form the R, G, and B sub-pixels shown in FIGS. 1B to 1). In this case, in the vapor-deposition masks 20R, 20G, and 20B, a first opening 21a1 and a third opening 21a3 of a resin film 21 are each formed in one, and a second opening 21a2 is formed in two in an opening 22a of the metal support layer 22, respectively.

Figure 4A:
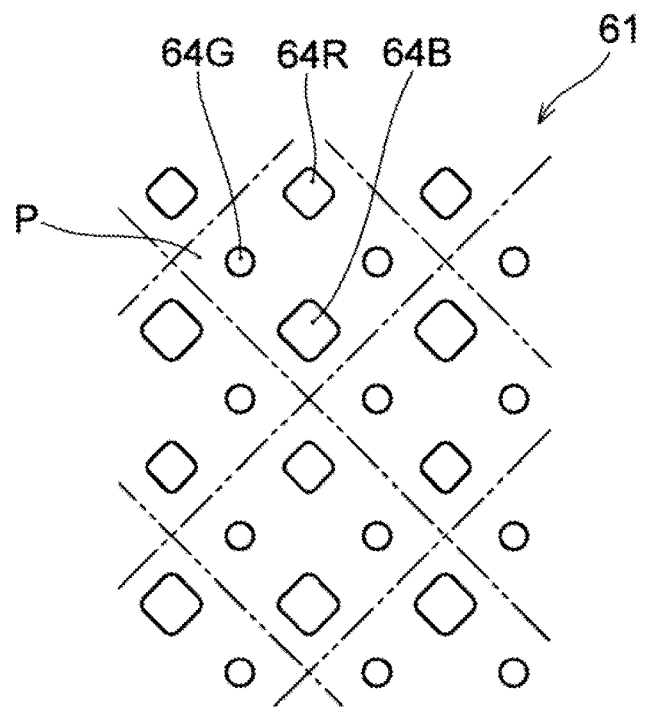
FIG. 4A shows an array of the same sub-pixels as in FIG. 3A, showing an example wherein the fourth opening pattern of the metal support layer is different.

Here, setting of the one pixel P in the array shown in FIG. 3A is not construed to be limited thereto, so that, as shown in FIG. 4A below, with respect to the one second opening 21a2 of the resin film 21, one pixel can be configured by a set of the first opening 21a1 and the third opening 21a3 for the neighboring pixel.

Figure 4B:
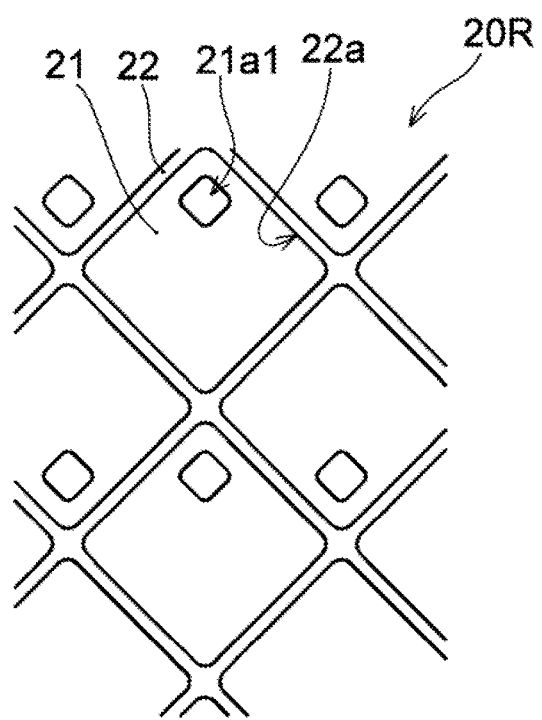
FIG. 4B schematically shows a plan view of the vapor-deposition mask to form a R sub-pixel in FIG. 4A.
Figure 4C:
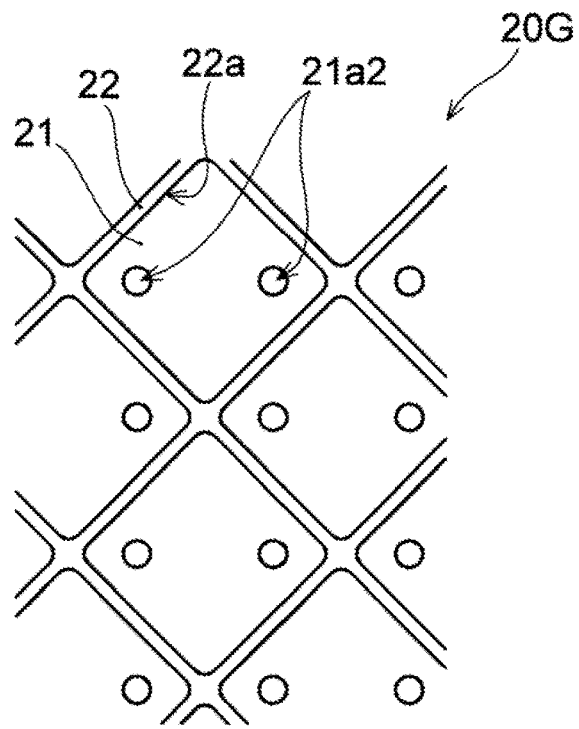
FIG. 4C schematically shows a plan view of the vapor-deposition mask to form a G sub-pixel in FIG. 4A.
Figure 4D:
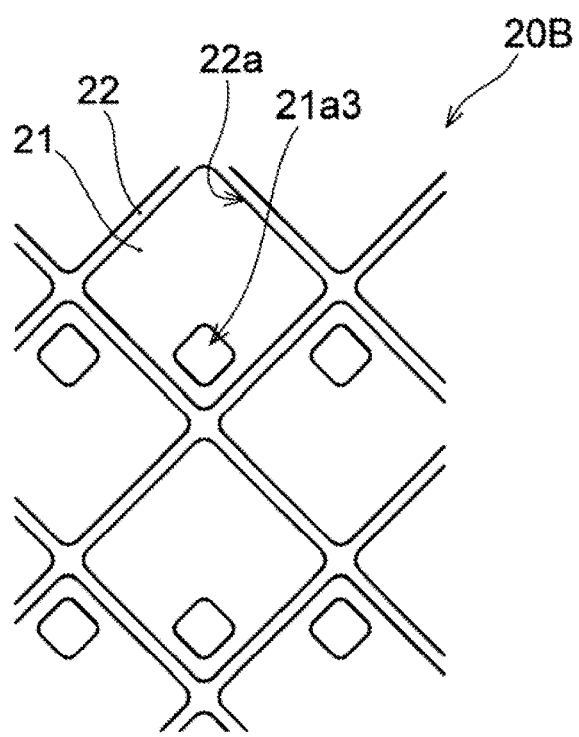
FIG. 4D schematically shows a plan view of the vapor-deposition mask to form a B sub-pixel in FIG. 4A.

Specifically, in the same array as the array of sub-pixels shown in FIG. 3A, one pixel P can be set as shown in FIG. 4A. In other words, while an area having a quadrilateral shape comprising one each of the R sub-pixel 64R and the B sub-pixel 64B and the two G sub-pixels 64G is set as one pixel in FIG. 3A, a diamond-shaped area comprising one each of the R sub-pixel 64R and the B sub-pixel 64B and the two G sub-pixels 64G can be set as one pixel P as shown in FIG. 4A. Even in this case, the opening 22a of the metal support layer 22 is formed such that it surrounds all of the first opening 21a1, the second opening 21a2, and the third opening 21a3 of the resin film 21 to form the R, G, and B sub-pixels making up the above-mentioned one pixel P. In other words, the fourth opening 22a can be formed as shown in FIGS. 3B to 3D, or the fourth opening 22a can be formed as shown in FIGS. 4B to 4D. To easily design the metal support layer 22, the opening 22a of the metal support layer 22 is preferably of a simple shape such as a quadrilateral or diamond shape.

Even the array shown in FIG. 3A can be configured to comprise at least one additional sub-pixel such as W (white) in the same manner as a case of the array shown in FIG. 1A, in which case the vapor-deposition mask corresponding thereto can be formed in the same manner as that described previously. Moreover, even the vapor-deposition mask to collectively vapor deposit at one time sub-pixels being in common to at least two of the respective sub-pixels can be formed in the same manner as that described previously.

Next, a method for manufacturing such vapor-deposition masks 10R, 10G, and 10B is explained with reference to the drawings. Here, the method for manufacturing the vapor-deposition mask 10R to form the R sub-pixel shown in FIG. 1B is explained with reference to FIGS. 5 to 7.

A method of manufacturing a vapor-deposition mask being the present embodiment comprises: forming a resin film 11 on a support substrate (S11); forming a metal support layer 12 on the resin film 11, the metal support layer 12 comprising a opening pattern of a fourth opening 12a (S12); irradiating laser light to the resin film 11 being exposed by the fourth opening 12a to form one or two opening patterns of a first opening 11a1, a second opening 11a2, and a third opening 11a3 for forming respectively a first sub-pixel 54R, a second sub-pixel 54G, and a third sub-pixel 54B making up one pixel of a display panel (S13); after irradiating laser light to a joint portion between the support substrate and the resin film (S16), lifting the resin film 11 and the metal support layer 12 off, from the support substrate (S17). The fourth opening 12a of the metal support layer 12 is formed so as to allow enclosing all of the first opening 11a1, the second opening 11a2, and the third opening 11a3 of the resin film 12.

Figure 6A:
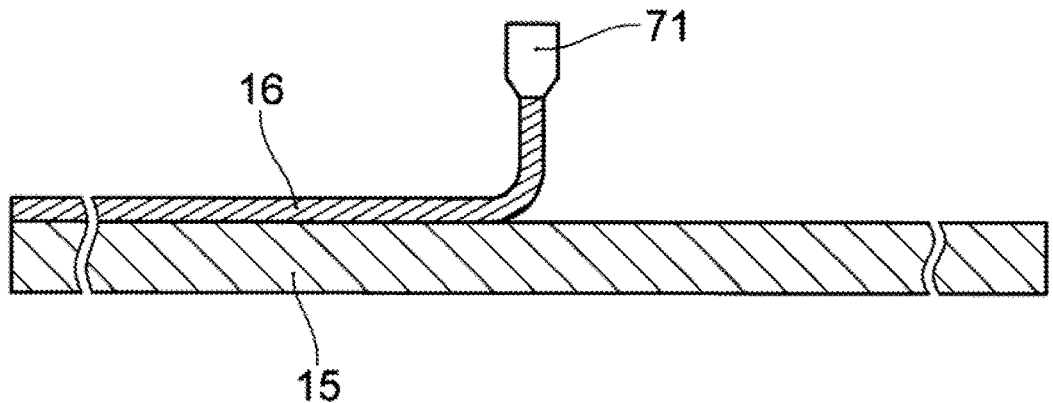
FIG. 6A schematically shows a cross-sectional view of one step of the method of manufacturing the vapor-deposition mask of the present embodiment.

Describing in further details, first, as shown in FIG. 6A, a liquid resin material is coated onto a support substrate 15 to form a resin coated layer 16 (S11 in FIG. 5). While any method of coating a resin material can be used as long as a layer thickness can be controlled, the resin material can be coated using a slit coater as shown in FIG. 6A, for example. In other words, a slot die 71 is relatively moved in a direction parallel to a surface of the support substrate 15 while discharging a liquid resin material in a strip shape from a tip portion of the slot die 71 to coat the resin material. The resin material can be coated using a different method such as a spin coater, for example, not the method using the slit coater. Forming the resin film 11 using such a method allows the resin coated layer 16 to be formed in close contact with the surface of the support substrate 15, so that the resin film 11 obtained by the resin coated layer 16 being cured is brought into close contact with the support substrate 15, and entrainment of air bubbles in between the resin film 11 and the support substrate 15 does not occur. Therefore, as described below, laser light is irradiated with the support substrate 15 and the resin film 11 being in close contact with each other at the time of forming the first opening 11a1 in the resin film 11, making it possible to accurately form the opening 11a of the resin film 11. The resin material can be a curable material and a material which absorbs laser light for laser processing as described below, so that the previously-described material is used.

The support substrate 15 is a substrate to cure by coating a resin material thereon and to form an opening pattern by irradiating laser light. For a material of the support substrate 15, such as glass, sapphire, or a GaN semiconductor can be adopted from a viewpoint of thermal resistance at the curing temperature of the resin coated layer 16 as well as the transmittance of laser light to be used at the time of lifting the support substrate 15 off as described below.

Thereafter, the resin coated layer 16 is heated, cured, and baked to form the resin film 11 (S11). The heating temperature can be set in a range of 400° C. or more, and 500° C. or less which is the curing temperature of the resin material or more, for example, and, in accordance with the above-mentioned heating conditions, the linear expansion coefficient of the resin film 11 can be adjusted. At this time, in a case that the difference in linear expansion coefficient between the resin film 11 and the support substrate 15 is large, the resin film 11 tends to curl due to an effect of thermal strain after the resin film 11 is lifted off from the support substrate 15 at room temperature. Therefore, it is preferable that the above-mentioned difference in linear expansion coefficient between the resin film 11 and the support substrate 15 be approximately 3 ppm/° C. or less.

Here, at the time of curing and baking, a short-wavelength light-absorbing layer (not shown) is formed at an interface between the resin film 11 and the support substrate 15. The short-wavelength light-absorbing layer is formed by the resin film 11 in the vicinity of a contact surface with the support substrate 15 being altered as a result of the short-wavelength light-absorbing layer being in contact with the support substrate 15 made of glass, which is a material different from the resin material, for example, at the time of baking the resin coated layer 16. As a result, the short-wavelength light-absorbing layer absorbs a short-wavelength light such as an ultraviolet light more than the resin film 11 main body. The thickness of the short-wavelength light-absorbing layer is 5 nm or more, and 100 nm or less. To form the short-wavelength light-absorbing layer, it is preferable to form the resin coated layer 16 after coating very thinly, on the support substrate 15, a surface modifier to improve the adhesion, such as a silane coupling agent.

Figure 6B:
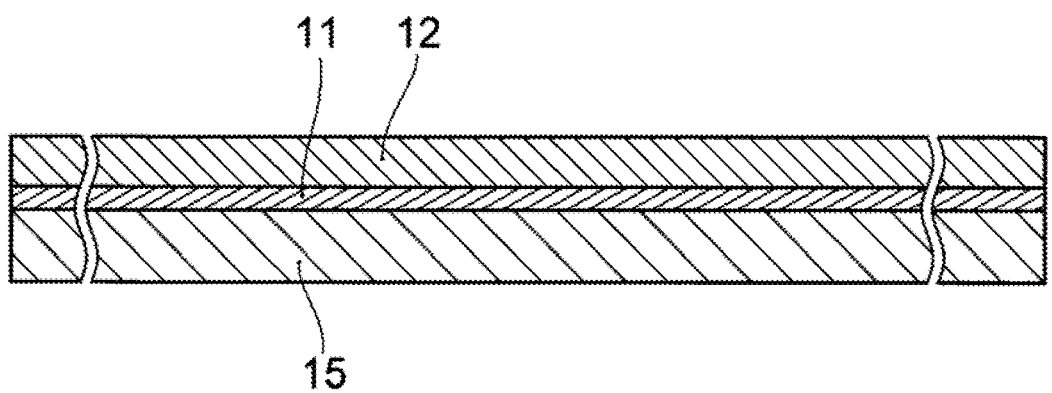
FIG. 6B schematically shows a cross-sectional view of one step of the method of manufacturing the vapor-deposition mask of the present embodiment.

Next, as shown in FIG. 6B, the metal support layer 12 is formed on the resin film 11 (S12). Specifically, the metal support layer 12 is formed by non-electrolytic plating in which a seed layer (not shown) with a thickness of 0.05 μm or more, and 0.5 μm or less is formed on the resin film 11, and then by electrolytic plating in which current is passed through the seed layer. The metal support layer 12 can be formed by sputtering method or vacuum deposition method besides plating method. Moreover, the metal support layer 12 can be formed by bonding a metal foil to the resin film 11, not using electrolytic plating. In a case of bonding the metal foil to the resin film 11, an opening pattern of a fourth opening is formed in the above-mentioned metal foil in advance to bond the above-mentioned metal foil to the resin film 11. In this way, in a case of forming each of the R, G, and B vapor-deposition masks, a joint structure of the resin film 11 and the metal support layer 12 can be obtained very easily without any need to carry out patterning of the metal support layer 12 as shown in FIG. 6C one by one.

Figure 6C:
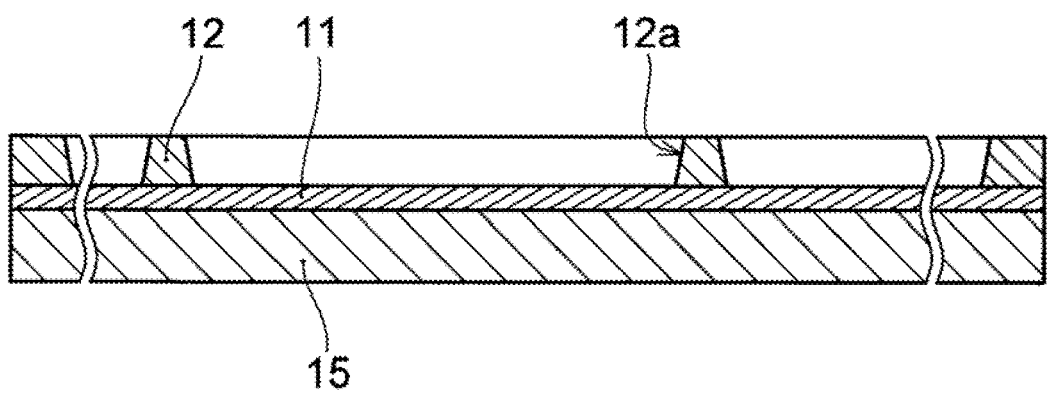
FIG. 6C schematically shows a cross-sectional view of one step of the method of manufacturing the vapor-deposition mask of the present embodiment.
Figure 8A:
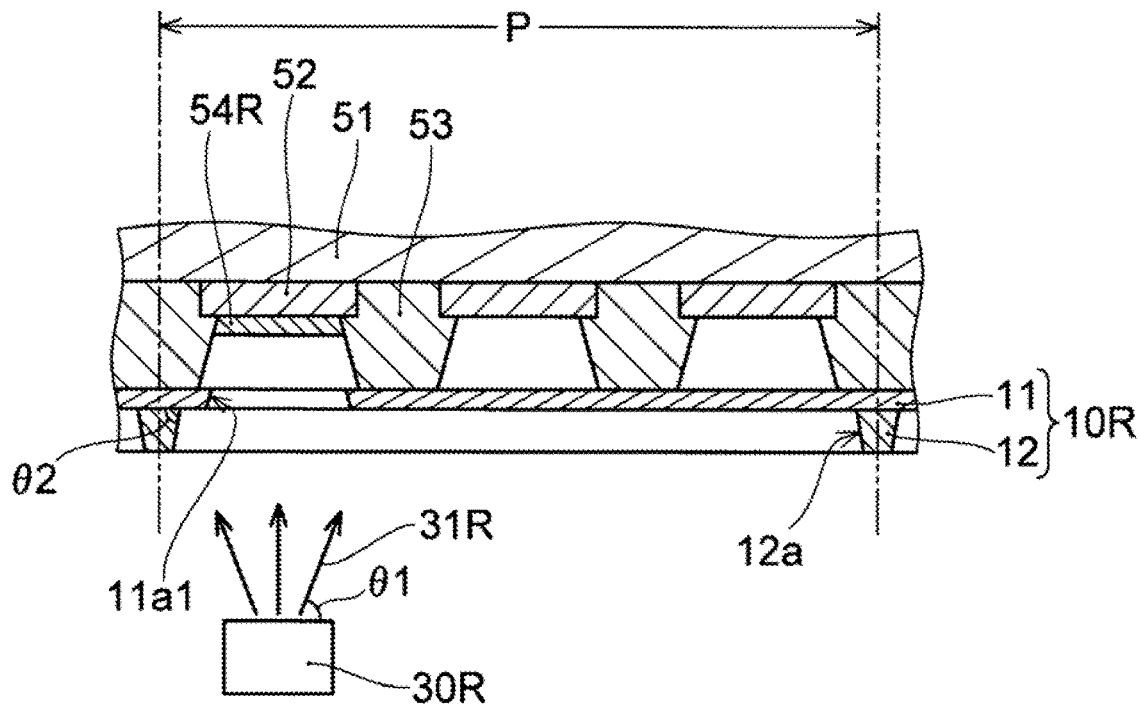
FIG. 8A schematically shows a cross-sectional view of one step of a method of manufacturing an organic-EL display apparatus being the present embodiment.

Then, as shown in FIG. 6C, an opening pattern of the opening 12a of the metal support layer 12 is formed by etching, for example (S13). As described above, the fourth opening 12a is formed in the metal support layer 12 so as to comprise all of the openings 11a1, 11a2, and 11a3 corresponding to one pixel to form the R, G, and B sub-pixels. For example, the fourth opening 12a is preferably formed in a tapered shape by dry etching or wet etching via a resist layer (not shown). This is because, in this way, while an organic material 31R comes flying in a trumpet-shaped bundle (referring to a vapor-deposition beam) having a given angle θ1 (a vapor-deposition angle) from a vapor-deposition source 30R as shown in FIG. 8A, even the vapor-deposition particles at the lateral end of the vapor-deposition beam are not shielded, but can reach a first electrode 52 (for example, an anode) on an apparatus substrate 51 to be subject to vapor deposited. Strictly speaking, a taper angle θ2 of the mask (an acute angle formed by the taper with the bottom surface) is preferably a vapor-deposition angle θ1 or less. In a case of bonding the above-described metal foil, the metal foil in which the opening pattern is formed in advance by pressing or etching is bonded to the resin film 11. In the vapor-deposition mask 10R according to the present embodiment, as the vapor-deposition mask 10R has the same opening pattern and size of the fourth opening 12a of the metal support layer 12 as those of the vapor-deposition mask 10G, 10B to form the G and B sub-pixels, etching can be carried out using a resist layer having the same opening size and opening pattern, making it possible to simplify manufacturing process of the vapor-deposition masks 10R, 10G, and 10B.

Figure 6D:
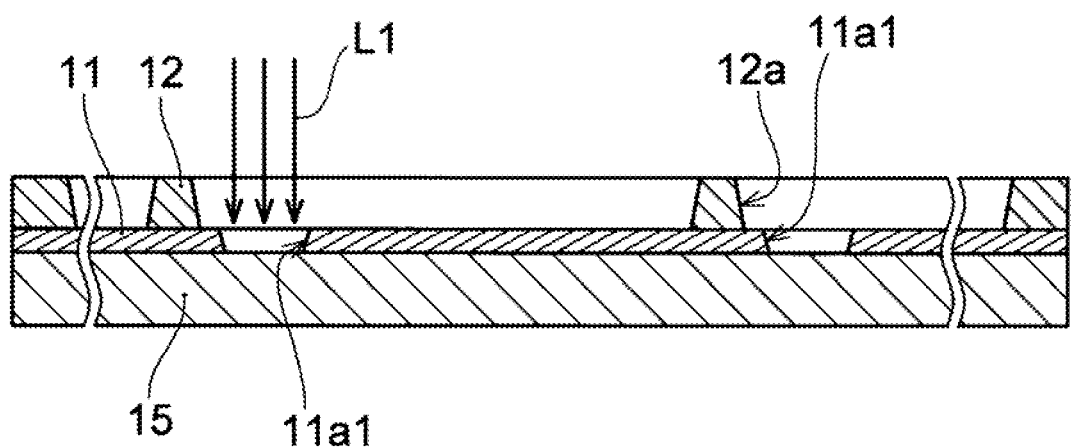
FIG. 6D schematically shows a cross-sectional view of one step of the method of manufacturing the vapor-deposition mask of the present embodiment.
Figure 7A:
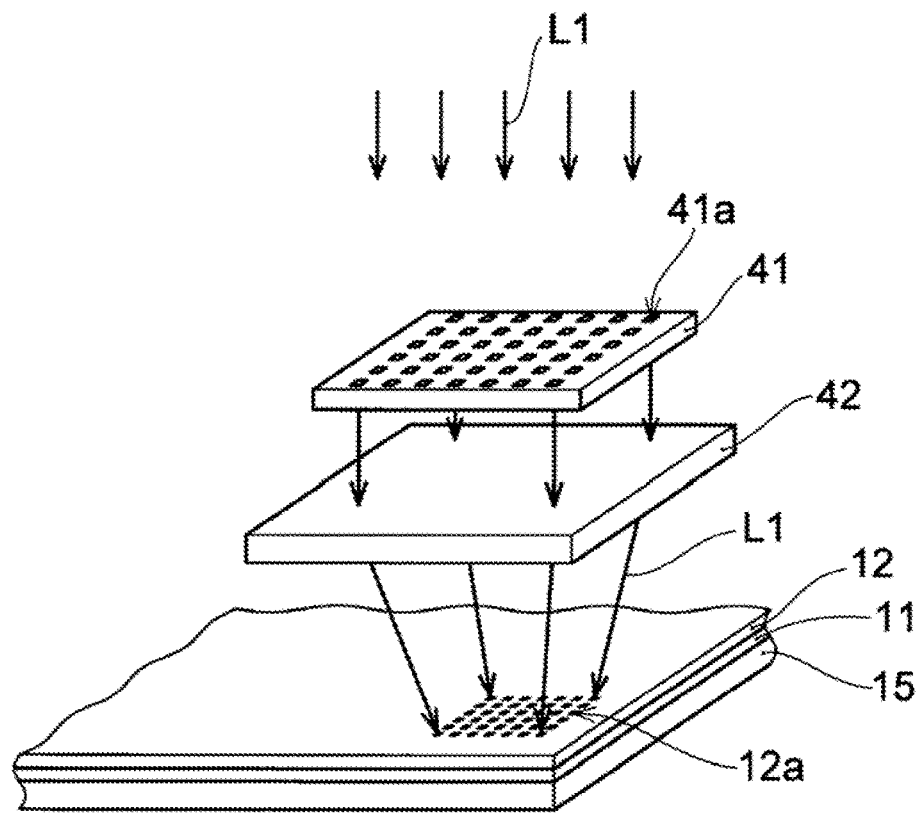
FIG. 7A schematically shows a perspective view of one step of the method of manufacturing the vapor-deposition mask the present embodiment, and shows a view explaining forming of an opening in a resin film.

Next, as shown in FIG. 6D, an opening pattern of the first opening 11a1 of the resin film 11 is formed by irradiating laser light L1 (S14). Specifically, as shown in FIG. 7A, the laser light L1 passing through a laser mask 41 comprising an aperture pattern in which an aperture 41a having a desired size is arrayed at a constant interval, and an optical lens 42 for collecting light, such as a convex lens, is irradiated to the resin film 11 through the opening 12a of the metal support layer 12. Then, while a stepper and an irradiation apparatus (not shown) to irradiate the laser light L1 is relatively moved in a direction parallel to the support substrate 15 to irradiate, the laser light L1 of reduced size and array is irradiated onto the resin film 11 being exposed from the opening 12a of the metal support layer 12, in accordance with the aperture pattern of the aperture 41a of the laser mask 41 on which the laser light L1 is irradiated, for each unit region of irradiation of the laser light L1. In this way, as shown in FIG. 6D, a portion of the resin film 11 onto which the laser light L1 is irradiated is sublimed. As a result, one time irradiating of the laser light L1 causes the pattern of the first opening 11a1 according to the pattern and the size of the R pixel to be successively formed in a collective manner onto a given region of the resin film 11, and repeated irradiating of the laser light L1 causes all the first openings 11a1 to be formed in the resin film 11.

At this time, the resin film 11 is being bonded to the metal support layer 12, so that tension in the resin film 11 differs in accordance with the opening pattern of the fourth opening 12a of the metal support layer 12. However, among the vapor-deposition masks 10R, 10G, and 10B according to the present embodiment, the opening patterns of the fourth openings 11a of the metal support layers 12 are the same each other, so that tensions in the resin films 11 of all of the vapor-deposition masks 10R, 10G, and 10B is the same each other. Therefore, in a case that the irradiation conditions of the laser light L1 are the same, the ways in which tension in the resin films 11 are released at the time of opening the opening 11a1, the second opening 11a2, and the third opening 11a3 in the resin film 11 are also the same each other, making it possible to form the first opening 11a1, the second opening 11a2, and the third opening 11a3 in a well-reproducible manner.

With respect to the irradiation condition of the laser light, the laser light having a wavelength of 355 nm (third harmonics wave of YAG laser), for example, is irradiated to the resin film 11 under a condition that the pulse frequency is 60 Hz, the pulse width is several nsec to 20 nsec, an intensity of the laser light on an irradiation surface is 0.25 J/cm² to 0.45 J/cm² for each one pulse, and a number of shots (the number of pulses to be irradiated) is 50 or more, and 200 or less. The laser light to be irradiated is construed not to be limited to the YAG laser, so that it can be any laser light having a wavelength the resin film 11 can absorb. For example, another laser light such as excimer laser, or He—Cd laser can also be used. Moreover, as mentioned previously, the unit region of the irradiation of the laser light L1 can be a region corresponding to a collection of the plurality of the fourth openings 12a of the metal support layer 12, or a region corresponding to one opening 12a.

In the laser mask 41, a light-shielding thin layer such as chromium is formed on a transparent substrate such as a quartz glass plate to transmit the laser light, and a pattern is formed in the above-mentioned light-shielding thin layer, so that the aperture 41a is formed.

Then, a frame 13 is bonded to a surface of the metal support layer 12 (S15). The above-mentioned bonding of the frame can also be carried out by bonding, to the frame 13, the resin film 11 with tension being applied thereto, after lifting the resin film 11 and the metal support film 12 off, from the support substrate 15. Specifically, the frame 13 is made of a metal, and is fixed to the metal support layer 12 by such as laser welding. The frame 13 is used to facilitate handling of the vapor-deposition mask 10R, and also to obtain the vapor-deposition mask 10R with the resin film 11 being extended. This is because, in a case that the resin film 11 has deflection, a so-called shadow occurs at the time of forming an organic layer making up the R, G, and B sub-pixels, so that the organic deposition layers 54R, 54G, and 54B cannot be vapor deposited in a highly accurate manner. In a case that the resin film 11 is always being stretched, the frame 13 does not necessarily have to be bonded. In a case that tension is applied to the resin film 11, for example, rigidity that can endure the above-mentioned tension is required for the frame 13, so that a metal plate having a thickness of 25 mm or more, and 50 mm or less is used, but, in a case that the use thereof is not necessary, the frame 13 is not necessary. Moreover, in a case of bonding the frame 13, it is not necessary to bond the frame 13 to the surface of the metal support layer 12, but the frame 13 can be bonded to end surfaces of the resin film 11 and the metal support layer 12 using an adhesive.

Figure 7B:
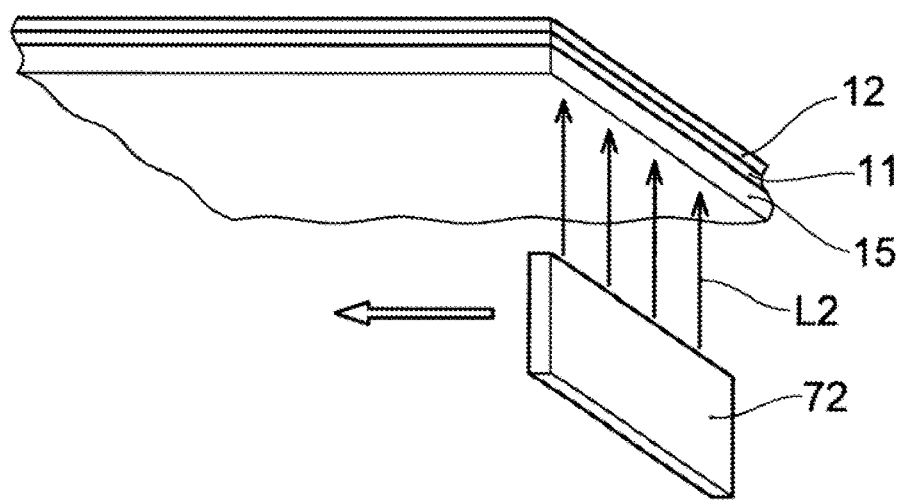
FIG. 7B schematically shows a perspective view of one step of the method of manufacturing the vapor-deposition mask of the present embodiment, and shows a view explaining irradiating of laser light at the time of lifting the resin film and the metal support layer off, from a support substrate.

Then, the laser light is irradiated to the interface between the support substrate 15 and the resin film 11 (S16). Specifically, as shown in FIG. 7B, by using a linear light source 72 and moving the linear light source 72 in a direction parallel to a rear surface of the support substrate 15, laser light L2 is scanned from the rear surface of the support substrate 15 to the short-wavelength light-absorbing layer (not shown) from one end to the other end of the support substrate 15, the short-wavelength light-absorbing layer being formed at the interface between the support substrate 15 and the resin film 11. Then, the short-wavelength light-absorbing layer is further altered, causing the joint force between the supporting substrate 15 and the resin film 11 to be lost across the entire surfaces thereof. An intensity of the laser light L2 to be used here is as small as not to alter a main body of the resin film 11. From such a viewpoint, it suffices that the light source be a light source radiating a short-wavelength light, such as a xenon lamp, a high-pressure mercury lamp, or an ultraviolet ray LED, not necessarily radiating laser light. At this time, in a portion with the metal support layer 12, the laser light L2 is reflected, causing an effect of the laser light L2 to the short-wavelength light-absorbing layer to be greater. Therefore, while an effect of a portion of the metal support layer 12 in a direction perpendicular to a irradiation direction of the laser light L2 is less, an output of the laser light L2 needs to be lowered in a portion of the metal support layer 12 being parallel to the irradiation direction of the laser light L2. However, in the present embodiment, as the opening pattern of the opening 12a of the metal support layer 12 is the same among the vapor-deposition masks 10R, 10G, and 10B, there is no need to change the output of the laser light L2 in accordance with each of the vapor-deposition masks 10R, 10G, and 10B.

Figure 6E:
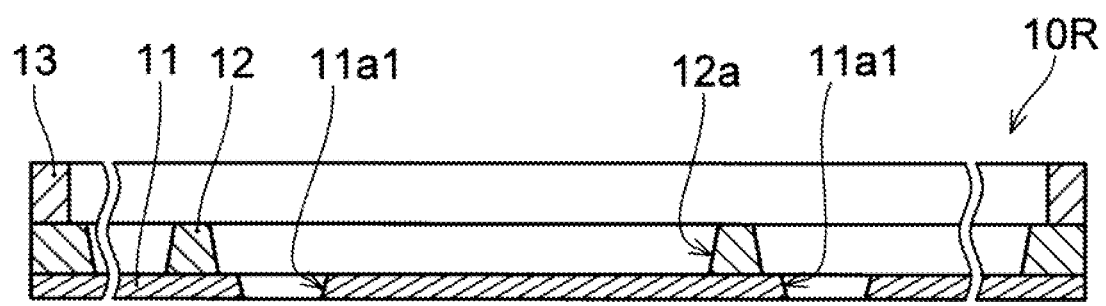
FIG. 6E schematically shows a cross-sectional view of one step of the method of manufacturing the vapor-deposition mask of the present embodiment.

Finally, as shown in FIG. 6E, the resin film 11 and the metal support layer 12 are lifted off from the support substrate 15 to complete the vapor-deposition mask 10R (S17). Specifically, as described above, the irradiation of the laser light L2 causes the joint force between the support substrate 15 and the resin film 11 to be lost across the entire surface of the interface therebetween, so that the resin film 11 and the metal support layer 12 are easily separated from the support substrate 15.

According to such a method for manufacturing the vapor-deposition mask 10R, the vapor-deposition mask 10R to form the R sub-pixel is manufactured such that all of the openings 11a to form the R, G, and B sub-pixels are comprised therein and are protected by the metal support layer 12, so that the metal support layer 12 can also be used for the other vapor-deposition masks 10G and 10B. Therefore, at the time of manufacturing each of the vapor-deposition masks 10R, 10G, and 10B, a shape of the resist layer at the time of forming the opening 12a in the metal support layer 12 by etching can be used in common, or the metal support layer 12 in common being produced in advance can also be bonded to the resin film of the G and B sub-pixels, so that one set of vapor-deposition masks 10R, 10G, and 10B can be manufactured through uniform operations.

Figure 8B:
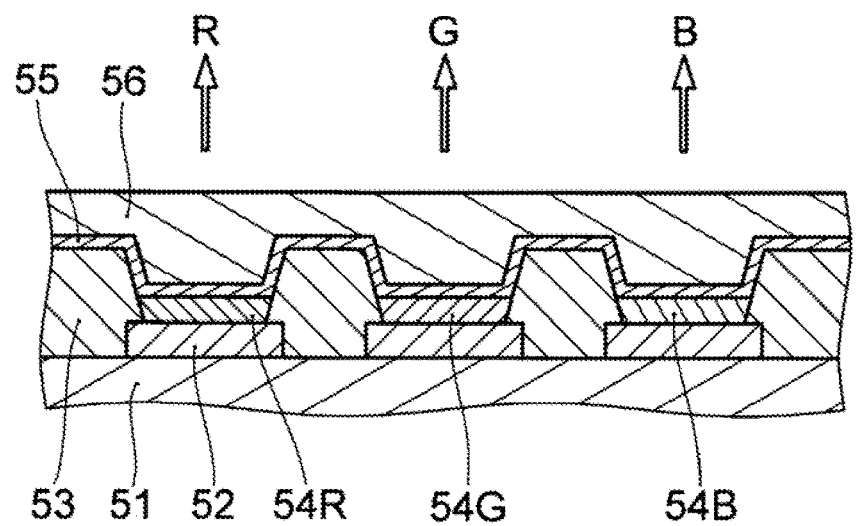
FIG. 8B schematically shows a cross-sectional view of the organic-EL display apparatus manufactured by the method of manufacturing the organic-EL display apparatus in FIG. 8A.
Figure 9A:
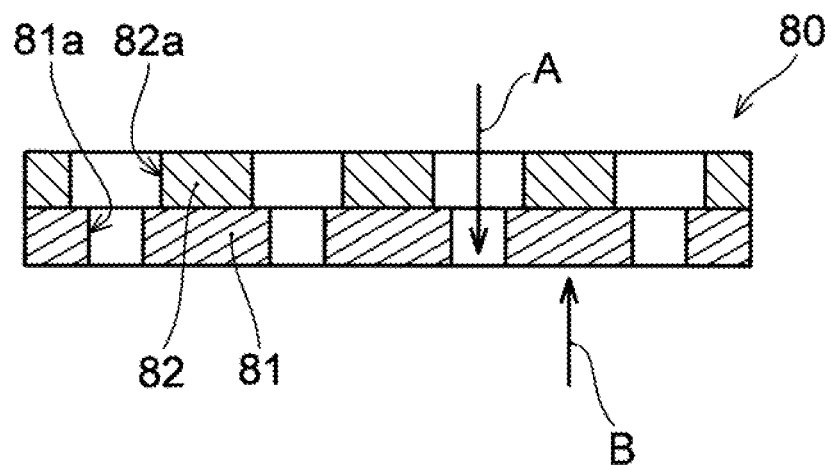
FIG. 9A shows an explanatory cross-sectional view of the conventional vapor-deposition mask.
Figure 9B:
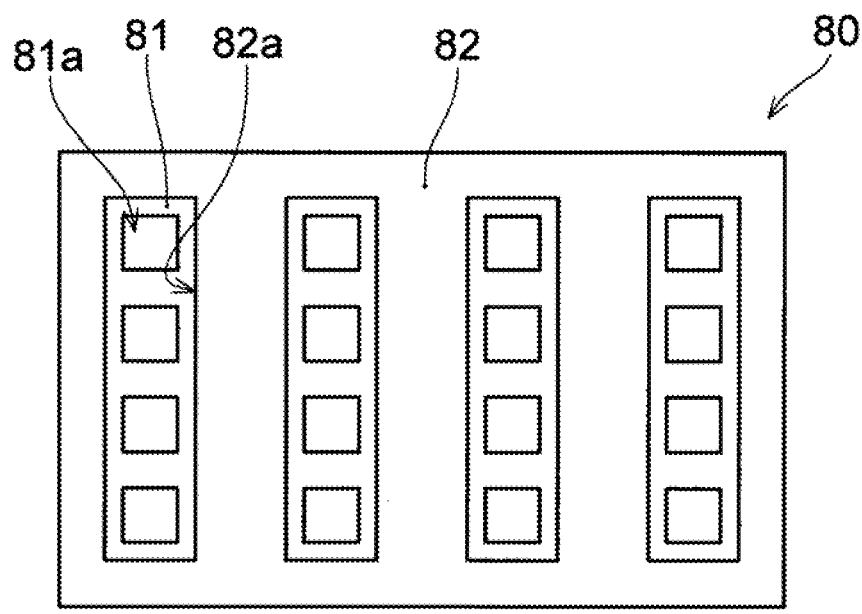
FIG. 9B shows an explanatory plan view of the conventional vapor-deposition mask.

Next, an explanation of a method of manufacturing an organic-EL display apparatus, the explanation being mainly for the process of forming an organic deposition layer making up the R sub-pixel, is provided with reference to FIGS. 8A and 8B.

The method of manufacturing the organic-EL display apparatus according to the present embodiment comprises: forming at least a TFT, a planarizing layer, and a first electrode and so forth on a base substrate to provide an apparatus substrate 51; vapor depositing an organic material on a surface of the apparatus substrate 51 using a vapor-deposition mask 10R to form an organic deposition layer 54; and forming a second electrode 55 (see FIG. 8B1) on the organic deposition layer 54.

To form organic deposition layers 54R, 54G, and 54B making up one pixel P, as in a case of forming the organic deposition layer 54R for the R sub-pixel shown in FIG. 8A, for example, the vapor-deposition mask 10R and the apparatus substrate 51 are aligned and superimposed, and an organic material 31R is vapor deposited on a first electrode 52 (anode) to form the organic deposition layer 54R. While not shown, in a portion without the first opening 11a1, the organic material 31R is deposited on the vapor-deposition mask 10R. Then, after the organic material is deposited to all of the R, G, and B sub-pixels, the second electrode 55 (cathode) is formed on the organic deposition layers 54R, 54G, and 54B.

In the apparatus substrate 51, the TFT is formed in each of the R, G, and B sub-pixels of each pixel in the base substrate formed of a glass substrate (not shown), and the first electrode 52 being connected to the TFT is formed on the planarizing layer by a combination of an ITO layer and a metal layer being such as Ag or APC. As shown in FIGS. 8A and 8B, an insulating bank 53 made of $SiO_2$ or acryl is formed between the sub-pixels to partition the sub-pixels as well as to prevent the first electrode 52 and the second electrode 55 from being in contact with each other.

The vapor-deposition mask R to form the R sub-pixel is aligned and fixed onto the above-mentioned insulating bank 53. In a case that the metal support layer 12 of the vapor-deposition mask 10R is formed using a magnetic substance, for example, the above-mentioned fixing is carried out by arranging a magnet on a rear surface of the apparatus substrate 51 and causing the magnet to attract the vapor-deposition mask 10R across the apparatus substrate 51 (magnetic chuck). The first opening 11a1 of the vapor-deposition mask 10R is formed to be smaller than the interval of the surfaces of the insulating bank 53. This allows the organic material 31R not to be adhered to a lateral wall of the insulating bank 53 as much as possible, making it possible to prevent degradation of light-emitting efficiency.

In the above-mentioned state, as shown in FIG. 8A, evaporating the organic material 31R from a vapor-deposition source (crucible) 30R, the vapor-deposition source (crucible) 30R to form the R sub-pixel in the vapor-deposition apparatus, the organic material 31R is vapor deposited only in the opening 11a of the vapor-deposition mask 10R and the vapor-deposition layer 54R for the R sub-pixel is formed on the first electrode 52 for the R sub-pixel. As described above, the opening 11a of the vapor-deposition mask 10R is formed to be smaller than the interval of the surfaces of the insulating bank 53, so that the organic material 31R is hardly deposited onto the lateral wall of the insulating bank 53. As a result, the organic deposition layer 54R is substantially deposited only onto the first electrode 52. After the above-mentioned vapor-deposition process is finished, the organic deposition layers 54G and 54B for the G and B sub-pixels are formed by using the vapor-deposition masks 10G and 10B to form the G and B sub-pixels in the same manner, respectively.

While the organic deposition layers 54R, 54G, and 54B are shown as single layers in FIGS. 8A and 8B, in actuality, these are formed as a plurality of deposition layers, each formed of different materials. For example, as a layer to be in contact with the first electrode (anode) 52, a positive hole injection layer can be provided that is formed of an ionization-energy-compatible material to improve positive hole injectability. A positive hole transport layer that improves stable transport of positive holes and allows trapping of electrons into a light-emitting layer (energy barrier) is formed on the above-mentioned positive hole injection layer using an amine-based material, for example. Moreover, a light-emitting layer to be selected in accordance with a light-emitting wavelength by doping a red or green organic fluorescent material to $Alq_3$ for red or green, for example, is formed thereon. Furthermore, as a blue color material, a DSA-based organic material is used. An electron transport layer to further improve electron injectability as well as to stably transport electrons is formed on the light-emitting layer using such as $Alg_3$. The organic deposition layers 54R, 54G, and 54B are formed by the above-mentioned layers being respectively deposited with a thickness of several tens of nm each. An electron injection layer such as LiF or Liq can also be provided between the organic layer and the metal electrode to improve the electron injectability.

As a light-emitting layer for each of the organic deposition layers 54R, 54G, and 54B, an organic layer of a material according to each color of R, G, and B is deposited. Moreover, emphasizing the light-emitting performance, it is preferable that the positive hole transport layer and the electron transport layer be deposited separately using a material suitable for the light-emitting layer. However, taking into account the material cost aspect, they can also be deposited using the same material being common to two colors of R, G, and B. In a case of depositing the organic material being common to sub-pixels of two colors of R and G, R and B, or G and B, the vapor-deposition mask is formed in which the openings are formed for the sub-pixels for which the organic material to be deposited is in common. In a case that the organic layers differ among individual sub-pixels, as described above, for example, the vapor-deposition masks 10R, 10G, and 10B to form the respective R, G, and B sub-pixels can be used to continuously vapor deposit the respective organic deposition layers 54R, 54G, and 54B, while, in a case that it is desirable to vapor deposit the organic material being common to the sub-pixels of two colors, the vapor deposition of the organic material for the R, G, and B sub-pixels is carried out using the vapor-deposition masks 10R, 10G, and 10B to form the respective sub-pixels up to below the above-mentioned common layer and, at the time of vapor depositing the common organic material, the vapor-deposition masks in which are formed the openings corresponding to the two sub-pixels are used to vapor deposit the organic material for the sub-pixels of two colors at one time.

Then, when forming of all of the organic deposition layers 54R, 54G, and 54B are finished, the second electrode 55 is formed on the entire surface of what is described in the above. In a case of a top-emission type organic-EL display apparatus shown in FIG. 8B, it employs a scheme in which light is radiated from a side of a barrier layer 56, so that a thin metal layer having a small work function, such as an Mg—Ag alloy, is used, for example, for the second electrode 55. In a case of a bottom-emission type organic-EL display apparatus in which light is radiated from a side of the apparatus substrate 51, such as an ITO is used for the first electrode 52, while a thick metal layer having a small work function, such as Al, is used for the second electrode. Thereafter, the barrier layer 56 made of such as $Si_3N_4$, for example, is formed on a surface of the second electrode 55. Then, the entirety of what is described in the above is sealed by a sealing layer (not shown) formed of such as glass or a resin film, so that the organic deposition layers 54R, 54G, and 54B are configured not to absorb moisture. The organic deposition layers 54R, 54G, and 54B can also be configured such that a common use of the organic deposition layers 54R, 54G, and 54B is made as much as possible and, at the surface side thereof, a color filter is provided.

According to such the method of manufacturing the organic-EL display apparatus, the organic deposition layers 54R, 54G, and 54B are formed using the above-described vapor-deposition masks 10R, 10G, and 10B, making it possible to efficiently produce the organic deposition layers.

SUMMARY

A vapor-deposition mask according to aspect 1 comprises: a resin film comprising at least one opening pattern of a first opening pattern in which a first opening to form a first sub-pixel making up one pixel of a display panel is arrayed at a constant interval, a second opening pattern in which a second opening to form a second sub-pixel making up the one pixel is arrayed at the constant interval, and a third opening pattern in which a third opening to form a third sub-pixel making up the one pixel is arrayed at the constant interval; and a metal support layer being joined to the resin film and comprising an opening pattern of a fourth opening being formed so as to allow enclosing all of the first opening, the second opening, and the third opening of the resin film, wherein any one or two openings of the first opening, the second opening, and the third opening of the resin film are formed in a region being exposed by the fourth opening of the metal support layer.

According to the configuration of aspect 1, the fourth opening of the metal support layer is formed so as to enclose all of the first opening, the second opening, and the third opening of the resin film, so that, regardless of whether any of the first opening, the second opening, and the third opening is formed, the metal support layer does not close them. Therefore, the opening patterns of the metal support layers are the same in the vapor-deposition masks to form all of the sub-pixels, making it possible to make conditions for the laser light irradiation the same at the time of lifting the resin films and the metal support layers off. Moreover, the metal support layers can be used in common from each other in a case of manufacturing the vapor-deposition masks for the above-mentioned sub-pixels.

According to the vapor-deposition mask of aspect 2, in the above-described aspect 1, the fourth opening is formed to enclose one unit or more, and ten units or less, the arrangement of the first opening, the second opening, and the third opening making up the one pixel being the one unit.

According to the configuration of aspect 2, the fourth opening is formed to enclose a small number of units, the small number being one unit or more, and ten units or less, so that the metal support layers can be used in common while making sure that deflections does not occur in the resin films.

According the vapor-deposition mask of aspect 3, in the above-described aspect 1 or 2, the planar shape of the fourth opening can be a quadrilateral shape or a diamond shape.

According to the configuration of aspect 3, a planar shape of the fourth opening is formed in a simple shape such as the quadrilateral shape or the diamond shape, making it possible to easily design the fourth opening.

According to the vapor-deposition mask of aspect 4, in the above-described aspect 3, a corner portion of the fourth opening is formed in an arc shape whose radius of curvature is 1 µm or more, and 5 µm or less.

According to the configuration of aspect 4, the fourth opening is formed in the arc shape with the given radius of curvature, a joint surface between the resin film and the metal support layer further increases, making it possible to further suppress deflection of the resin film.

According to the vapor-deposition mask of aspect 5, in any one of the above-described aspects 2 to 4, at least one of the first sub-pixel, the second sub-pixel, and the third sub-pixel of the one pixel of the display panel is formed in two or more, with the resin film being exposed by the fourth opening.

The configuration according to aspect 5 makes it possible form the vapor-deposition mask in alignment with various sub-pixel arrays.

A method of manufacturing a vapor-deposition mask according to aspect 6 is characterized in comprising: forming a resin film on a support substrate; forming a metal support layer on the resin film, the metal support layer comprising an opening pattern of a fourth opening; irradiating laser light to the resin film being exposed by the fourth opening to form any one or two opening patterns of a first opening, a second opening, and a third opening for forming respectively a first sub-pixel, a second sub-pixel, and a third sub-pixel making up one pixel of a display panel; after irradiating laser light to a joint portion between the support substrate and the resin film, lifting the resin film and the metal support layer off, from the support substrate, wherein the fourth opening of the metal support layer is formed so as to allow enclosing all of the first opening, the second opening, and the third opening of the resin film.

According to the configuration of aspect 6, since the metal support layers can be used in common from each other in the vapor-deposition masks to form all of the first to third sub-pixels, conditions for irradiating laser light does not need to be changed each time for the vapor-deposition mask to form all of the above-mentioned sub-pixels at the time of lifting the resin films and the metal support layers off, from the support substrate, making it possible to manufacture the vapor-deposition masks through uniform operations.

According to the method of manufacturing the vapor-deposition mask of aspect 7, in the above-described aspect 6, the forming of the resin film is carried out by dropping a liquid resin onto the support substrate, and, thereafter, baking to form a short-wavelength light-absorbing layer between the resin film and the support substrate.

According to the configuration of aspect 7, the short-wavelength light-absorbing layer is formed between the resin film and the support substrate, making it possible to easily lift the resin film and the metal support layer off, from the support substrate by irradiation of laser light.

According to the method of manufacturing the vapor-deposition mask of aspect 8, in the above-described aspect 6 or 7, forming of the metal support layer is carried out by forming a metal layer on the resin film, and, thereafter, patterning the metal layer to form the opening pattern of the fourth opening.

According to the configuration of aspect 8, in the vapor-deposition masks to form all of the first to third sub-pixels, shapes of the resist layers at the time of patterning the metal layers can be used in common from each other, making it possible to manufacture a set of vapor-deposition masks through uniform operations.

According to the method of manufacturing the vapor-deposition mask of aspect 9, in the above-described 6 or 7, forming of the metal support layer is carried out by bonding, to the resin film, a metal foil on which the opening pattern of the fourth opening is formed.

According to the configuration of aspect 9, the metal support layer common to the vapor-deposition masks to form the first to third sub-pixels can be produced in advance, and the metal support being in common can be bonded to the resin film of the above-mentioned vapor-deposition masks, making it possible to manufacture a set of vapor-deposition masks through uniform operations.

According to the method of manufacturing the vapor-deposition mask of aspect 10, in any one of the above-described aspects 6 to 9, forming of the first opening, the second opening, and the third opening is carried out by irradiating laser light via an aperture of a laser mask.

According to the configuration of aspect 10, processes to form one or two opening patterns of the first opening, the second opening, and the third opening can be carried out collectively.

A method of manufacturing an organic-EL display apparatus according to aspect 11 is characterized by comprising: forming at least a TFT and a first electrode on an apparatus substrate; vapor depositing an organic material on the surface of the apparatus substrate using a vapor-deposition mask according to any one of the above-described aspects 1 to 5 to form an organic deposition layer; and forming a second electrode on the organic deposition layer.

According to the configuration of aspect 11, the organic deposition layer is formed using the vapor-deposition mask of any one of the above-described aspects 1 to 5, making it possible to efficiently form the organic deposition layer.

DESCRIPTION OF REFERENCE NUMERALS

10R Vapor-deposition mask (for R pixel)
10G Vapor-deposition mask (for G pixel)
10B Vapor-deposition mask (for B pixel)
11 Resin film
11a1 Opening of resin film
11a2 Opening of resin film
11a3 Opening of resin film
12 Metal support layer
12A Opening of metal support layer
15 Support substrate
20R Vapor-deposition mask (for R pixel)
20G Vapor-deposition mask (for G pixel)

20B Vapor-deposition mask (for B pixel)
21 Resin film
21a1 Opening of resin film
21a2 Opening of resin film
21a3 Opening of resin film
22 Metal support layer
22a Opening of metal support layer
31R Organic material
41 Laser mask
41a Aperture of laser mask
51 Apparatus substrate
52 First electrode
54R Organic deposition layer (R pixel)
54G Organic deposition layer (G pixel)
54B Organic deposition layer (B pixel)
55 Second electrode
61 Apparatus substrate
64R Organic deposition layer (R pixel)
64G Organic deposition layer (G pixel)
64B Organic deposition layer (B pixel)
P One pixel
L1 Laser light
L2 Laser light

The invention claimed is:

1. A vapor-deposition mask comprising:
a resin film comprising at least one opening pattern of a first opening pattern in which a first opening to form a first sub-pixel making up one pixel of a display panel is arrayed at a constant interval, a second opening pattern in which a second opening to form a second sub-pixel making up the one pixel is arrayed at the constant interval, and a third opening pattern in which a third opening to form a third sub-pixel making up the one pixel is arrayed at the constant interval; and
a metal support layer being joined to the resin film and comprising an opening pattern of a fourth opening being formed so as to allow enclosing all of the first opening, the second opening, and the third opening of the resin film, wherein
any one or two openings of the first opening, the second opening, and the third opening of the resin film are formed in a region being exposed by the fourth opening of the metal support layer,
a planar shape of the fourth opening is a quadrilateral shape or a diamond shape, and
a corner portion of the fourth opening is formed in an arc shape whose radius of curvature is 1 µm or more, and 5 µm or less.

2. The vapor-deposition mask according to claim 1, wherein the fourth opening is formed to enclose one unit or more, and ten units or less, the arrangement of the first opening, the second opening, and the third opening making up the one pixel being the one unit.

3. The vapor-deposition mask according to claim 1, wherein at least one of the first sub-pixel, the second sub-pixel, and the third sub-pixel of the one pixel of the display panel is formed in two or more, with the resin film being exposed by the fourth opening.

4. A method of manufacturing a vapor-deposition mask comprising:
forming a plurality of resin films on a plurality of support substrates, respectively;
forming a plurality of metal support layers on the plurality of resin films, respectively, each of plurality of metal support layers comprising an opening pattern of a fourth opening;
irradiating laser light to each of the plurality of resin films being exposed by the fourth opening to form either one or two opening patterns of a first opening, a second opening, and a third opening for forming respectively a first sub-pixel, a second sub-pixel, and a third sub-pixel making up one pixel of a display panel;
after irradiating ultraviolet light to a joint portion between each of the plurality of support substrates and each of the plurality of resin films, lifting the plurality of resin films and the plurality of metal support layers off, from the plurality of support substrates, respectively, wherein
the fourth opening of each of the plurality of metal support layers is formed so as to allow enclosing all of the first opening, the second opening, and the third opening of the resin film, and
in irradiating the ultraviolet light, using a linear light source, scanning of the linear light source is carried out while scanning from one end toward the other end of each of the plurality of support substrates, and adjusting intensity of the linear light source in accordance with an amount of metal of each of the plurality of metal support layers in a region irradiated by the linear light source in conjunction with the scanning of the linear light source, and the irradiating is carried out under the same irradiation condition for the linear light source even in either case of the resin film having one or two opening patterns of the first opening, the second opening, and the third opening.

5. The method of manufacturing the vapor-deposition mask according to claim 4, wherein forming of each of the plurality of resin films is carried out by dropping a liquid resin onto each of the plurality of support, and, thereafter, baking to form a short-wavelength light-absorbing layer between each of the plurality of resin films and each of the plurality of support substrates.

6. The method of manufacturing the vapor-deposition mask according to claim 4, wherein forming of each of the plurality of support substrates is carried out by forming a metal layer on the resin film, and, thereafter, patterning the metal layer to form the opening pattern of the fourth opening.

7. The method of manufacturing the vapor-deposition mask according to claim 4, wherein forming of each of the plurality of support substrates is carried out by bonding, to the resin film, a metal foil on which the opening pattern of the fourth opening is formed.

8. The method of manufacturing the vapor-deposition mask according to claim 4, wherein the forming of the first opening, the second opening, and the third opening is carried out by irradiating laser light via an aperture of a laser mask.

9. The method of manufacturing the vapor-deposition mask according to claim 4, wherein the fourth opening is formed to enclose one unit or more, and ten units or less, the arrangement of the first opening, the second opening, and the third opening making up the one pixel being the one unit.

10. The method of manufacturing the vapor-deposition mask according to claim 4, wherein a planar shape of the fourth opening is a quadrilateral shape or a diamond shape.

11. The method of manufacturing the vapor-deposition mask according to claim 4, wherein a corner portion of the fourth opening is formed in an arc shape whose radius of curvature is 1 µm or more, and 5 µm or less.

12. The method of manufacturing the vapor-deposition mask according to claim 4, wherein at least one of the first sub-pixel, the second sub-pixel, and the third sub-pixel of the one pixel of the display panel is formed in two or more, with the resin film being exposed by the fourth opening.

13. A method of manufacturing an organic-EL display apparatus, the method comprising:
   forming at least a TFT and a first electrode on an apparatus substrate;
   vapor depositing an organic material on a surface of the apparatus substrate using a vapor-deposition mask to form an organic deposition layer; and
   forming a second electrode on the organic deposition layer;
   wherein forming the vapor-deposition mask by using the method according to claim 4.

* * * * *